United States Patent
Imada

(10) Patent No.: US 9,337,326 B2
(45) Date of Patent: May 10, 2016

(54) COMPOUND SEMICONDUCTOR DEVICE AND METHOD FOR FABRICATING THE SAME

(71) Applicant: FUJITSU LIMITED, Kawasaki-shi, Kanagawa (JP)

(72) Inventor: Tadahiro Imada, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/812,643

(22) Filed: Jul. 29, 2015

(65) Prior Publication Data

US 2015/0333164 A1 Nov. 19, 2015

Related U.S. Application Data

(60) Division of application No. 13/617,377, filed on Sep. 14, 2012, now Pat. No. 9,166,030, which is a continuation of application No. PCT/JP2010/054887, filed on Mar. 19, 2010.

(51) Int. Cl.
  *H01L 21/338* (2006.01)
  *H01L 29/778* (2006.01)
  (Continued)

(52) U.S. Cl.
  CPC .......... *H01L 29/7782* (2013.01); *H01L 29/517* (2013.01); *H01L 29/518* (2013.01); *H01L 29/66431* (2013.01); *H01L 29/66462* (2013.01);
  (Continued)

(58) Field of Classification Search
  CPC .................. H01L 29/66431; H01L 29/778

USPC .................................................. 257/192–194
See application file for complete search history.

(56) References Cited

U.S. PATENT DOCUMENTS 5,436,474 A * 7/1995 Banerjee et al. .............. 257/194
6,373,098 B1   4/2002 Brush
(Continued)

FOREIGN PATENT DOCUMENTS

JP  2000-349092     12/2000
JP  2006-286942 A1  10/2006
(Continued)

OTHER PUBLICATIONS

Office Action of Chinese Patent Application No. 201080065567.7 dated Oct. 13, 2014.
(Continued)

*Primary Examiner* — Christine Enad
(74) *Attorney, Agent, or Firm* — Kratz, Quintos & Hanson, LLP

(57) ABSTRACT

A first GaN layer (2), a first AlGaN layer (3), a second GaN layer (4) and a third GaN layer (5) are formed in layers on a substrate (1). A second AlGaN layer (6) is formed on the sidewall of an opening (10A) formed in the multilayer structure. A gate electrode (8) is formed to fill an electrode trench (7a) in an insulating film (7). A portion (7c) of the insulating film (7) between the gate electrode (8) and the second AlGaN layer (6) functions as a gate insulating film. A source electrode (11) is formed above the gate electrode (8) and a drain electrode (12) is formed below the gate electrode (8). This configuration enables implementation of a miniatuarizable, reliable vertical HEMT that has a sufficiently high withstand voltage and high output power and is capable of a normally-off operation without problems that could otherwise result from the use of a p-type compound semiconductor.

10 Claims, 21 Drawing Sheets

(51) Int. Cl.
*H01L 29/51* (2006.01)
*H01L 29/66* (2006.01)
*H03F 1/32* (2006.01)
*H01L 29/20* (2006.01)
*H01L 29/205* (2006.01)
*H01L 29/423* (2006.01)
*H01L 21/02* (2006.01)

(52) U.S. Cl.
CPC .......... *H01L 29/778* (2013.01); *H01L 29/7786* (2013.01); *H01L 29/7788* (2013.01); *H01L 29/7789* (2013.01); *H03F 1/3247* (2013.01); *H01L 21/0254* (2013.01); *H01L 21/0262* (2013.01); *H01L 21/02458* (2013.01); *H01L 29/2003* (2013.01); *H01L 29/205* (2013.01); *H01L 29/4238* (2013.01); *H01L 29/42368* (2013.01)

(56) References Cited

U.S. PATENT DOCUMENTS

| | | | |
|---|---|---|---|
| 7,538,718 | B2 | 5/2009 | Ikeda |
| 7,592,647 | B2 | 9/2009 | Nakata |
| 8,044,434 | B2 | 10/2011 | Ohta |
| 2006/0220060 | A1 | 10/2006 | Nakata |
| 2008/0079009 | A1 | 4/2008 | Yaegashi |
| 2008/0180313 | A1 | 7/2008 | Ikeda |
| 2008/0237605 | A1* | 10/2008 | Murata et al. .................. 257/76 |
| 2009/0179227 | A1* | 7/2009 | Otake et al. .................. 257/192 |
| 2009/0230433 | A1 | 9/2009 | Yamaguchi |
| 2009/0321854 | A1 | 12/2009 | Ohta et al. |
| 2010/0006894 | A1* | 1/2010 | Ohta et al. .................. 257/192 |
| 2010/0019250 | A1* | 1/2010 | Nakamura et al. .............. 257/77 |
| 2010/0025730 | A1* | 2/2010 | Heikman et al. .............. 257/194 |
| 2012/0086015 | A1 | 4/2012 | Kyono et al. |

FOREIGN PATENT DOCUMENTS

| | | |
|---|---|---|
| JP | 2008-26901 A1 | 2/2008 |
| JP | 2008-53449 A1 | 3/2008 |
| JP | 2008-91595 A1 | 4/2008 |
| JP | 2008-192701 A1 | 8/2008 |
| JP | 2008-209382 A1 | 9/2008 |

OTHER PUBLICATIONS

Extended European Search Report dated Mar. 3, 2014 issued in counterpart application No. 10847946.0.
M. Kodama, et al.; "GaN-Based Trench Gate Metal Oxide Semiconductor Field-Effect Transistor Fabricated with Novel Wet Etching;" Applied Physics Express 1; 2008; pp. 021104-1-021104-3 (3 Sheets)/ p. 1 of specification.
H. Otake, at al.; Vertical GaN-Based Trench Gate Metal Oxide Semiconductor Field-Effect Transistors on GaN Bulk Substrates; Applied Physics Express 1; 2008; pp. 011105-1-011105-3 (3 Sheets)/p. 1 of specification.
International Search Report for International Application No. PCT/JP2010/054887 dated Jun. 29, 2010.
International Preliminary Report on Patentability mailed Nov. 1, 2012 in counterpart application No. PCT/JP2010/054887.
Office Action of U.S. Appl. No. 13/740,535 dated Aug. 14, 2015.

* cited by examiner

COMPOUND SEMICONDUCTOR DEVICE AND METHOD FOR FABRICATING THE SAME

CROSS-REFERENCE TO RELATED APPLICATION

This application is a Divisional Application of U.S. patent application Ser. No. 13/617,377, filed on Sep. 14, 2012, which is a continuation application of International Application PCT/W2010/054887 filed on Mar. 19, 2010 and designated the U.S., the entire contents of both of which are incorporated herein by reference.

FIELD

The present invention relates to a compound semiconductor device including a compound semiconductor layer and a method for fabricating the compound semiconductor device.

BACKGROUND

Compound-semiconductor-based filed effect transistors (FETs), for example GaN-based FETs have higher withstand voltages than conventional Si-MOSFETs and hold great promise as a high-withstand-voltage power device in applications such as automobiles.

Like conventional Si-MOSFETs, there are so-called lateral and vertical GaN-FETs. In a lateral FET, a drain electrode, a gate electrode and a source electrode are disposed side by side on a semiconductor substrate or a semiconductor layer. In a vertical FET, a drain electrode, a gate electrode, and a source electrode are stacked in layers.

The vertical FET has the following advantages over the lateral FET.

The amount of current per semiconductor chip is larger because current flows through vertical paths. The area of the chip is smaller because the source electrode and the drain electrode, which require large areas because a high current flows through them, are disposed above and below, respectively, the gate electrode. Furthermore, since the proportion of metal per semiconductor chip is larger, the vertical FET has better dissipation characteristics.

Vertical GaN-FETs have been devised in the past. In the GaN-FET, a compound semiconductor layer has the so-called npn structure where layers of compound semiconductors, namely n-type GaN (n-GaN), p-type GaN (p-GaN), and n-GaN are stacked. A gate electrode is provided to fill a trench formed in the compound semiconductor layers (See Patent Literature 1 and Non Patent Literatures 1 and 2).

PATENT LITERATURE

Patent Literature 1: Japanese Laid-Open Patent Publication No. 2008-192701

NON PATENT LITERATURE

Non Patent Literature 1: Applied Physics Express 1 (2008) 011105
Non Patent Literature 2: Applied Physics Express (2008) 021104

SUMMARY

However, the existing vertical GaN-FETs have the following problems, which have prevented commercialization.

Since p-GaN is used in the compound semiconductor layer and n-GaN exists on p-GaN, p-GaN is not activated. A p-type impurity, for example Mg migrates during operation of the transistor.

In the existing vertical GaN-FETs, two-dimensional gas (2DEG) having a high electron density and high electron mobility does not exist due to their structure. Accordingly, the existing GaN-FETs cannot achieve a high withstand voltage and high output power expected of a compound semiconductor device.

One mode of a compound semiconductor device includes: a first electrode; a compound semiconductor layer which is formed above the first electrode and includes an opening; a second electrode formed above the compound semiconductor layer; and a gate electrode embedded in the opening lined with an insulating film; wherein the compound semiconductor layer includes: a first compound semiconductor; a second compound semiconductor formed on the first compound semiconductor; a third compound semiconductor formed on the second compound semiconductor; and a fourth compound semiconductor in contact with a side surface of the insulating film, a side surface of the first compound semiconductor, a side surface of the second compound semiconductor, and a side surface of the third compound semiconductor; and a two-dimensional electron gas is produced at an interface of the first compound semiconductor with the fourth compound semiconductor and at an interface of the third compound semiconductor with the fourth compound semiconductor.

Another mode of a compound semiconductor device includes: a first electrode; a compound semiconductor layer which is formed above the first electrode and includes an opening; a second electrode formed above the compound semiconductor layer; and a gate electrode embedded in the opening lined with an insulating film; wherein the compound semiconductor layer includes: a first compound semiconductor; a second compound semiconductor formed on the first compound semiconductor; a third compound semiconductor formed on the second compound semiconductor; and a fourth compound semiconductor in contact with a side surface of the insulating film, a side surface of the first compound semiconductor, a side surface of the second compound semiconductor, and a side surface of the third compound semiconductor; and the lattice constant of the second compound semiconductor is smaller than the lattice constants of the first compound semiconductor and the third compound semiconductor; and the lattice constant of the fourth compound semiconductor is smaller than the lattice constants of the first compound semiconductor and the third compound semiconductor.

One mode of a method for fabricating a compound semiconductor device involves: forming a first compound semiconductor, a second compound semiconductor that has a lattice constant smaller than the lattice constant of the first compound semiconductor, and a third compound semiconductor that has a lattice constant greater than the lattice constant of the second compound semiconductor, in such a manner that the first, second and third compound semiconductors have an opening; forming a fourth compound semiconductor on a side surface which is an inner wall of the opening, the fourth compound semiconductor having a lattice constant smaller than the lattice constants of the first compound semiconductor and the third compound semiconductor; forming an insulating film to cover the inner wall surface of the opening; forming a gate electrode to fill the opening lined with the insulating film; and forming a first electrode below the first compound semiconductor and forming a second electrode above the third compound semiconductor.

Advantageous Effects of Invention

The modes described above implement a miniatuarizable, reliable vertical HEMT having a sufficiently high withstand voltage and high output power without problems that could otherwise result from the use of a p-type compound semiconductor. In addition, a normally-off operation in which no current flows in the absence of a voltage at the gate electrode is implemented in the compound semiconductor and on and off of the transistor can be properly controlled.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Embodiments will be described below in detail with reference to drawings.

First Embodiment

In a first embodiment, a device configuration of and a method for fabricating a compound semiconductor device, which is a so-called vertical high electron mobility transistor (HEMT).

[Device Configuration of Vertical HEMT]

Figure 1:
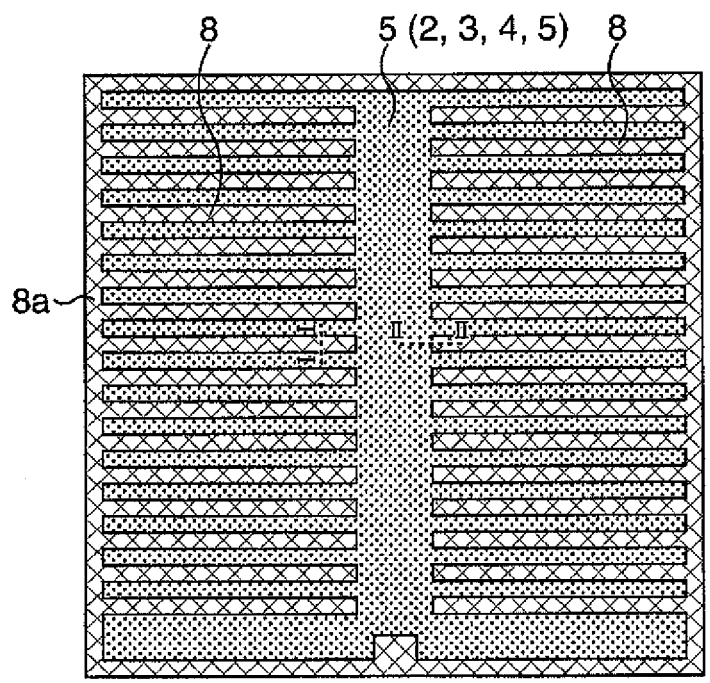
FIG. 1 is a schematic plan view of a vertical HEMT according to a first embodiment.
Figure 2:
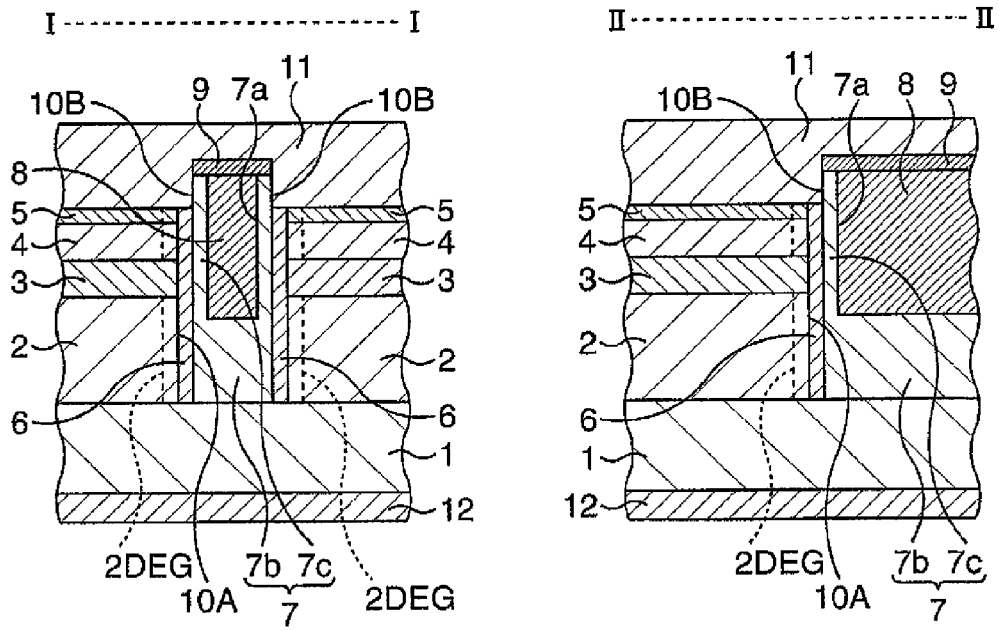
FIG. 2 is a schematic cross-sectional view illustrating a configuration of the HEMT according to the first embodiment.

FIG. 1 is a schematic plan view of a vertical HEMT according to the first embodiment. For ease of understanding, a structure above a gate electrode is omitted from FIG. 1. FIG. 2 is a schematic cross-sectional view of the vertical HEMT according to the first embodiment. The left-hand part of FIG. 2 illustrates a cross section taken along dashed line I-I in FIG. 1 and the right-hand part of FIG. 2 illustrates a cross-section taken along dashed line II-II in FIG. 1.

In the vertical HEMT according to this embodiment, a first compound semiconductor layer 2, a second compound semiconductor layer 3, a third compound semiconductor layer 4, and a fifth compound semiconductor layer 5 are formed in layers on a surface of a substrate 1. A fourth compound semiconductor layer 6 is formed on the sidewalls of an opening 10A formed in this multilayer structure. In the opening 10A, an insulating film 7 having an electrode trench 7a is formed on the fourth compound semiconductor layer 6. A gate electrode 8 is formed to fill the electrode trench 7a in the insulating film 7. An interlayer insulating film 9 is formed on the upper surface of the gate electrode 8 so that the gate electrode 8 is covered with the insulating film 7 and the interlayer insulating film 9. A source electrode 11 is formed over the gate electrode 8 so that the source electrode 11 fills an opening 10B formed in the insulating film 7 and the interlayer insulating film 9 and connects to the fifth compound semiconductor layer 5. A drain electrode 12 is formed on the back surface of the substrate 1 below the gate electrode 8.

The substrate 1 is a single-crystal GaN substrate, for example. The substrate 1 is preferably a high-resistance substrate so that a leak current to the substrate can be prevented. The substrate 1 is doped with a conductive impurity, for example Si, which is an n-type impurity, to be $n^+$ type. A conductive substrate is used in a vertical transistor because electrodes (drain electrodes) need to be formed on the back surface of the substrate. The substrate 1 may be a conductive sapphire substrate, a conductive SiC substrate, or a conductive single-crystal Si substrate, instead of the conductive GaN substrate.

The second compound semiconductor layer 3 has a smaller lattice constant than the first and third compound semiconductor layers 2 and 4. The fourth compound semiconductor layer 6 has a smaller lattice constant than the first and third compound semiconductor layers 2 and 4. In this configuration, strains are caused in the fourth compound semiconductor layer 6 by the difference in lattice constant between the first compound semiconductor layer 2 and the fourth compound semiconductor layer 6 and the difference in lattice constant between the third compound semiconductor layer 4 and the fourth compound semiconductor layer 6. The strains cause piezoelectric polarization and spontaneous polarization, which produce 2DEG (indicated by dashed lines in FIG. 2) at the interfaces of the first, third and fifth compound semiconductor layers 2, 4 and 5 with the fourth compound semiconductor layer 6. The 2DEG is an electron gas having a high electron density and a high electron mobility. This configuration implements a vertical HEMT structure that produces a desired 2DEG to provide a high withstand voltage and a high output power.

Because of the relationship among the lattice constants described above, little 2DEG is produced at the interface of the second compound semiconductor layer 3 with the fourth compound semiconductor layer 6. This configuration enables a desired, sufficient normally-off operation.

Furthermore, the second compound semiconductor layer 3 is preferably made of a compound semiconductor that has a smaller lattice constant than the fourth compound semiconductor layer 6. In that case, 2DEG is not produced at the interface of the second compound semiconductor layer 3 with the fourth compound semiconductor layer 6 (the interface of the second compound semiconductor layer 3 with the fourth compound semiconductor layer 6 is made a non-2DEG-producing region.) This configuration enables a complete normally-off operation.

A source electrode 11 is formed directly on the surface of the fifth compound semiconductor layer 5. Accordingly, the contact resistance with the source electrode 11 can be reduced by heavily doping the fifth compound semiconductor layer 5 with a conductive impurity.

A plurality of gate electrodes 8 are formed in the shape of comb teeth (in the shape of fingers) as illustrated in FIG. 1. Each gate electrode 8 is formed 50 that one end of the gate electrode 8 is connected to a gate bus line 8a.

The insulating film 7 has electrode trenches 7a in each of which a gate electrode 8 is to be formed. A portion 7b that covers the bottom surface of the gate electrode 8 is formed thicker than a portion 7c that covers the side surfaces of the gate electrode 8.

The portion 7c functions as a gate insulating film for the gate electrode 8. The portion 7b is formed thicker than the portion 7c and thinner than or as thick as the first compound semiconductor layer 2. If the thickness of the portion 7b is less than or equal to that of the portion 7c, a sufficient withstand voltage cannot be imparted to the gate electrode 8. On the other hand, if the portion 7b is thicker than the first compound semiconductor layer 2, the side surfaces of the first compound semiconductor layer 2 will not overlap the side surfaces of the gate electrode 8 with the portion 7c (and the fourth compound semiconductor layer 6) between them. Consequently, the voltage of the gate electrode 8 may be insufficiently applied to the first compound semiconductor layer 2 and 2DEG with a desired concentration cannot be produced. Forming the portion 7b thicker than the portion 7c and thinner than or as thick as the first compound semiconductor layer 2 provides a sufficient distance between the gate electrode 8 and the drain electrode 11 to ensure a sufficient withstand voltage and also produce 2DEG with a desired high concentration.

Specific examples of a compound semiconductor used in a vertical HEMT according to this embodiment will be described below.

(1) Example where GaN and AlGaN are Used

GaN and AlGaN are compound semiconductors and the latter has a smaller lattice constant than the former. In this case, the layers are as follows. The first and third compound semiconductor layers 2 and 4 are GaN layers and the second and fourth compound semiconductor layers 3 and 6 are AlGaN layers. The fifth compound semiconductor layer 5 is an $n^+$-GaN layer heavily doped with an n-type impurity which is a conductive impurity. The first to fifth compound semiconductor layers 2 to 6 are formed by MOCVD, for example, which will be described later.

Due to the difference in lattice constant between GaN and AlGaN, 2DEG with a high electron density and a high electron mobility is produced at the interfaces of the first, third and fifth compound semiconductor layers 2, 4 and 5 with the fourth compound semiconductor layer 6.

Furthermore, the second and fourth compound semiconductor layers 3 and 6 are made of AlGaN with the same composition ratio, so that the second and fourth compound semiconductor layers 3 and 6 have the same lattice constant. Accordingly, no 2DEG is produced at the second compound semiconductor layer 3 with the fourth compound semiconductor layer 6 and a complete normally-off operation is achieved.

(2) Example where InAlN and AlN are Used

InAlN and AlN are compound semiconductors and the latter has a smaller lattice constant than the former. In this case, the layers are as follows. The first and the third compound semiconductor layers 2 and 4 are InAlN layers and the second and fourth compound semiconductor layers 3 and 6 are AlN layers. The fifth compound semiconductor layer 5 is an $n^+$-InAlN layer heavily doped with an n-type impurity which is a conductive impurity. The first to fifth compound semiconductor layers 2 to 6 are formed by MOCVD, for example, which will be described later.

Due to the difference in lattice constant between InAlN and AlN, 2DEG with a high electron density and a high electron mobility is produced at the interfaces of the first, third and fifth compound semiconductor layers 2, 4 and 5 with the fourth compound semiconductor layer 6.

Furthermore, the second and fourth compound semiconductor layers 3 and 6 are made of AlN having the same lattice constant. Accordingly, no 2DEG is produced at the interface of the second compound semiconductor layer 3 with the fourth compound semiconductor layer 6 and a complete normally-off operation is achieved.

(3) Example where InAlGaN and AlN are Used

InAlGaN and AlN are compound semiconductors and the latter has a smaller lattice constant than the former. In this case, the layers are as follows. The first and third compound semiconductor layers 2 and 4 are InAlGaN layers and the second and fourth compound semiconductor layers 3 and 6 are AlN layers. The fifth compound semiconductor layer 5 is an $n^+$-InAlGaN layer heavily doped with an n-type impurity which is a conductive impurity. The first to fifth compound semiconductor layers 2 to 6 are formed by MOCVD, for example, which will be described later.

Due to the difference in lattice constant between InAlGaN and AlN, 2DEG with a high electron density and a high electron mobility is produced at the interfaces of the first, third and fifth compound semiconductor layers 2, 4 and 5 with the fourth compound semiconductor layer 6.

Furthermore, the second and fourth compound semiconductor layers 3 and 6 are made of AlN having the same lattice constant. Accordingly, no 2DEG is produced at the interface of the second compound semiconductor layer 3 with the fourth compound semiconductor layer 6 and a complete normally-off operation is achieved.

(4) Example where InAlN and InAlGaN are Used

The lattice constant of one of InAlN and InAlGaN can be made greater or smaller than the other by adjusting the composition ratio among In, Al and Ga. By adjusting the composition ratio, the lattice constant of InAlN can be made smaller than that of InAlGaN or the lattice constant of InAlGaN can be made smaller than that of InAlN. Here, an example in which the lattice constant of InAlGaN is made smaller than that of InAlN will be illustrated. In this case, the layers are as follows. The first and third compound semiconductor layers 2 and 4 are InAlN layers and the second and fourth compound semiconductor layers 3 and 6 are InAlGaN layers. The fifth compound semiconductor layer 5 is an $n^+$-InAlN layer heavily doped with an n-type impurity which is a conductive impurity. The first to fifth compound semiconductor layers 2 to 6 are formed by MOCVD, for example, which will be described later.

Due to the difference in lattice constant between InAlN and InAlGaN, 2DEG with a high electron density and a high electron mobility is produced at the interfaces of the first, third and fifth compound semiconductor layers 2, 4 and 5 with the fourth compound semiconductor layer 6.

Furthermore, the second and fourth compound semiconductor layers 3 and 6 are made of InAlGaN with the same composition ratio, so that the second and fourth compound semiconductor layers 3 and 6 have the same lattice constant. Accordingly, no 2DEG is produced at the interface of the second compound semiconductor 3 with the fourth compound semiconductor layer 6 and a complete normally-off operation is achieved.

(5) Example where AlGaN with Different Al Composition Ratios are Used

The same compound semiconductor with different composition ratios have different lattice constants. One compound semiconductor, for example AlGaN with different lattice constants may be $Al_{0.3}Ga_{0.7}N$ and $Al_{0.5}Ga_{0.5}N$. The greater the ratio of Al in AlGaN, the smaller the lattice constant of AlGaN is. Accordingly, $Al_{0.5}Ga_{0.5}N$ has a smaller lattice constant than $Al_{0.3}Ga_{0.7}N$.

In this case, the layers are as follows. The first and third compound semiconductor layers 2 and 4 are $Al_{0.3}Ga_{0.7}N$ layers and the second and fourth compound semiconductor layers 3 and 6 are $Al_{0.5}Ga_{0.5}N$ layers. The fifth compound semiconductor layer 5 is an $n^+$-$Al_{0.3}Ga_{0.7}N$ layer heavily doped with an n-type impurity which is a conductive impurity. The first to fifth compound semiconductor layers 2 to 6 are formed by MOCVD, for example, which will be described later.

Due to the difference in lattice constant between $Al_{0.3}Ga_{0.7}N$ and $Al_{0.5}Ga_{0.5}N$, 2DEG with a high electron density and a high electron mobility is produced at the interfaces of the first, third and fifth compound semiconductors 2, 4 and 5 with the fourth compound semiconductor layer 6.

Furthermore, the second and fourth compound semiconductor layers 3 and 6 are made of $Al_{0.5}Ga_{0.5}N$, which has the same lattice constant. Accordingly, no 2DEG is produced at the interface of the second compound semiconductor layer 3 with the fourth compound semiconductor layer 6 and a complete normally-off operation is achieved.

It should be noted that two types of InAlN with different lattice constants resulting from different composition ratios between In and Al may be used. Alternatively, two types of InAlGaN with different lattice constants resulting from different composition ratios among In, Al and Ga may be used.

(6) Example where Three Different Compound Semiconductors are Used

Figure 3:
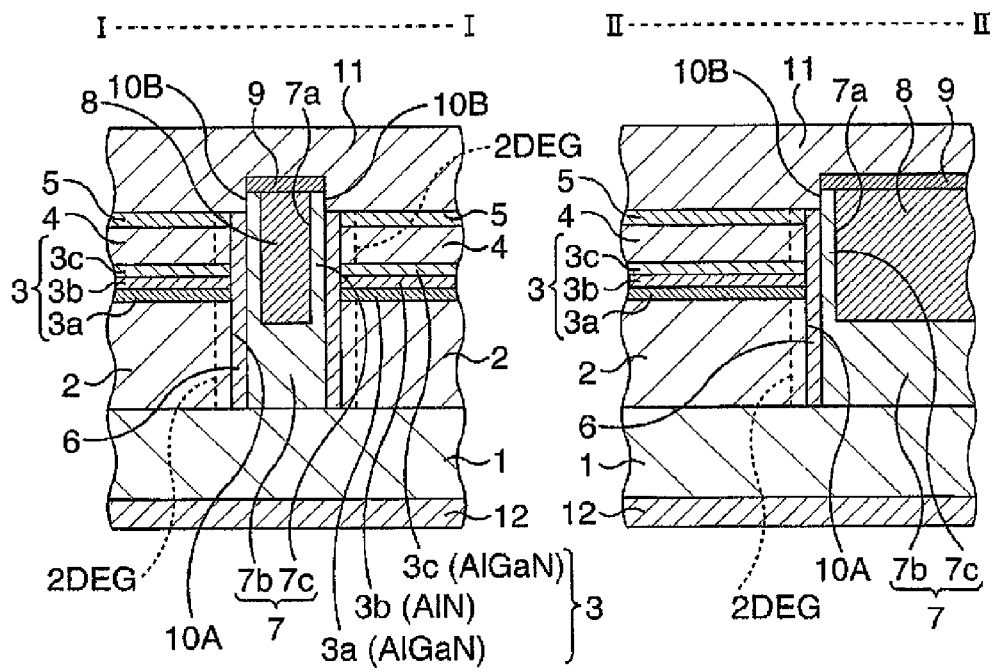
FIG. 3 is a schematic cross-sectional view of another exemplary vertical HEMT according to the first embodiment.

An example is shown in FIG. 3. In FIG. 3, a compound semiconductor different from GaN and AlGaN are used as the second compound semiconductor layer 3 in the configuration (1) in which GaNn and AlGaN are used. The second compound semiconductor layer 3 includes an AlGaN layer 3a, an AlN layer 3b, and an AlGaN layer 3c, for example, layered in this order. The AlGaN layers 3a and 3c which sandwich the AlN layer 3b are formed as buffer layers with consideration given to a large difference in lattice constant between GaN and AlN of the first and third compound semiconductor layers 2 and 4.

The AlGaN layer 3a of the second compound semiconductor layer 3 having the multilayer structure is formed to a thickness of approximately 100 nm, the AlN layer 3b is formed to a thickness of approximately 10 nm, and the AlGaN layer 3c is formed to a thickness of approximately 100 nm by MOCVD, for example, which will be described later.

Due to the difference in lattice constant between GaN and AlGaN, 2DEG with a high electron density and a high electron mobility is produced at the interfaces of the first, third fifth compound semiconductor layers 2, 4 and 5 with the fourth compound semiconductor layer 6.

Since the second compound semiconductor layer 3 includes the AlN layer 3b, leak current is significantly reduced. Furthermore, since the second compound semiconductor layer 3 includes the AlN layer 3b, the lattice constant of the second compound semiconductor layer 3 is practically smaller than that of the fourth compound semiconductor layer 6. Accordingly, no 2DEG is produced at the interface of the second compound semiconductor layer 3 with the fourth compound semiconductor layer 6 and a complete normally-off operation is achieved.

[Method for Fabricating Vertical HEMT]

A method for fabricating a vertical HEMT according to this embodiment will be described below, Here, an AlGaN/GaN HEMP including compound semiconductor layers of GaN and AlGaN will be taken as an example. The fabrication method described below is an example for providing a vertical HEMT according to this embodiment.

FIGS. 4A to 4D are schematic plan views illustrating the method for fabricating an AlGaN/GaN HEMT according to the first embodiment. FIGS. 5A to 5I are schematic cross-sectional views illustrating step by step the method for fabricating the AlGaN/GaN HEMT according to the first embodiment. The left-hand part of FIGS. 5A to 5I illustrates a cross section taken along dashed line I-I in FIGS. 4A to 4D and the right-hand part illustrates a cross section taken along dashed line II-II in FIGS. 4A to 4D.

For convenience of illustration and explanation, it is assumed here that the first, second, third, fifth and fourth compound semiconductor layers 2 to 6 in FIGS. 1 and 2 are a first GaN layer 2, a first AlGaN layer 3, a second GaN layer 4, a third GaN layer 5, and a second AlGaN layer 6, and the same reference numerals used in FIGS. 1 and 2 are given to these layers.

Figure 4A:
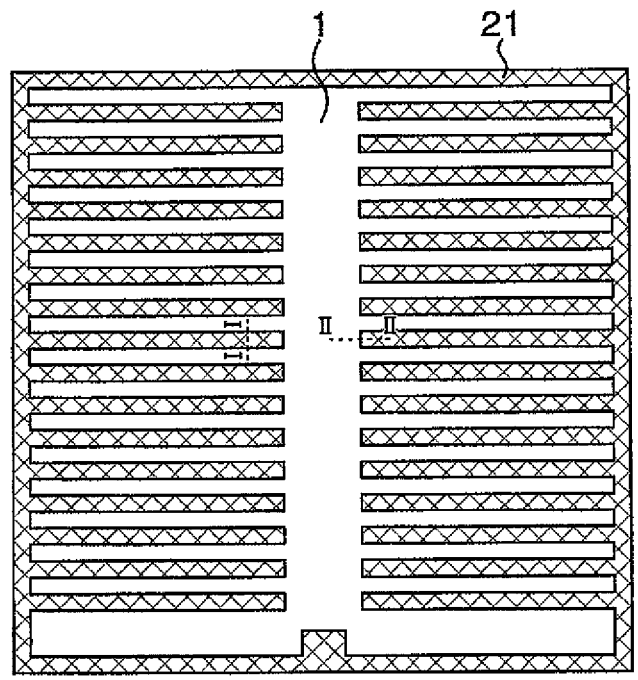
FIG. 4A is a schematic plan view illustrating a method for fabricating an AlGaN/GaN HEMT according to the first embodiment.
Figure 5A:
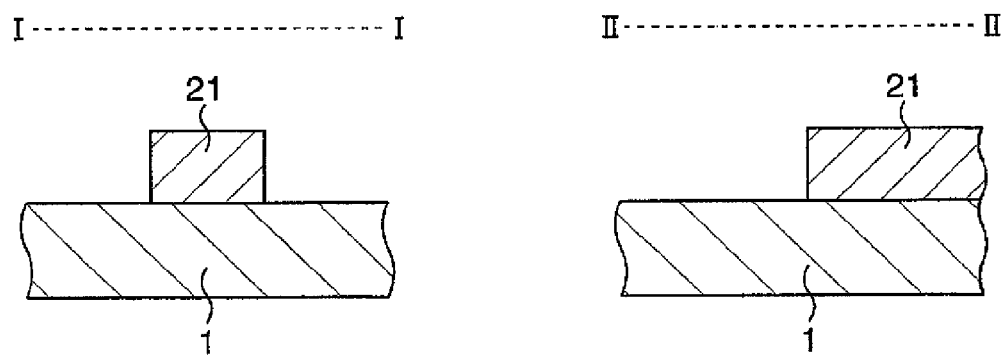
FIG. 5A is a schematic cross-sectional view illustrating the method for fabricating the AlGaN/GaN HEMT according to the first embodiment.

First, a mask 21 for selective growth is formed on a substrate 1 as illustrated in FIGS. 4A and 5A.

Specifically, a mask material, SiO here, is deposited on the substrate 1, which is a single-crystal GaN substrate, for example, by a method such as chemical vapor deposition (CVD). SiO is processed by lithography and dry etching to remove the SiO film from regions where epitaxial growth, which will be described later, is to be applied to form a mask 21 for selective growth. The mask 21 is formed in the shape of "comb-teeth" (in the shape of fingers) to cover the regions where gate electrodes, which will be described later, are to be formed, as illustrated in FIG. 4A.

Figure 4B:
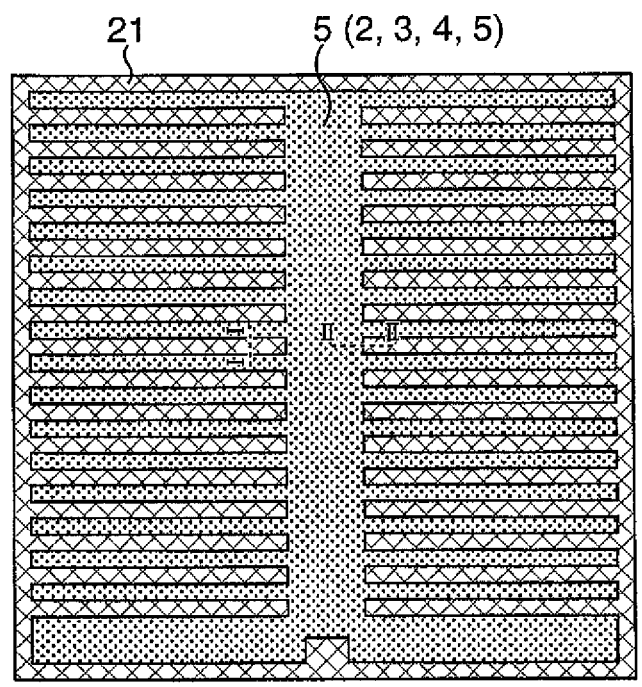
FIG. 4B is a schematic plan view illustrating the method for fabricating the AlGaN/GaN HEMT according to the first embodiment, continued from FIG. 4A.
Figure 5B:
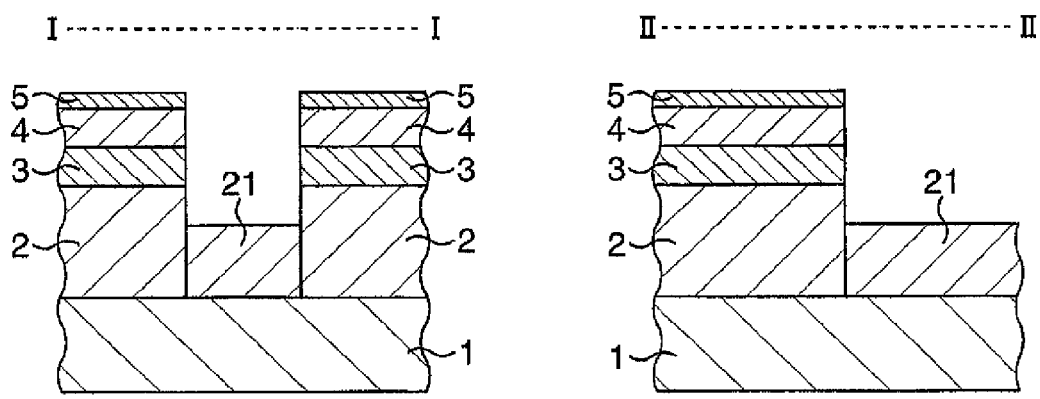
FIG. 5B is a schematic cross-sectional view illustrating the method for fabricating the AlGaN/GaN HEMT according to the first embodiment, continued from FIG. 5A.

Then the first GaN layer 2, the first AlGaN layer 3, the second GaN layer 4, and the third GaN layer 5 are formed in that order as illustrated in FIGS. 4B and 5B.

The first and second GaN layers 2 and 4 are made of n-GaN doped with an n-type impurity, here Si. The first AlGaN layer 3 is made of intentionally undoped AlGaN (i-AlGaN). The third GaN layer 5 is made of n$^+$-GaN doped more heavily with an n-type impurity, for example Si, than the first and second GaN layers 2 and 4.

Specifically, the following compound semiconductors are grown by metal organic chemical vapor deposition (MOCVD). Note that other method, for example molecular beam epitaxy (MBE) may be used instead of MOCVD.

Figure 6:
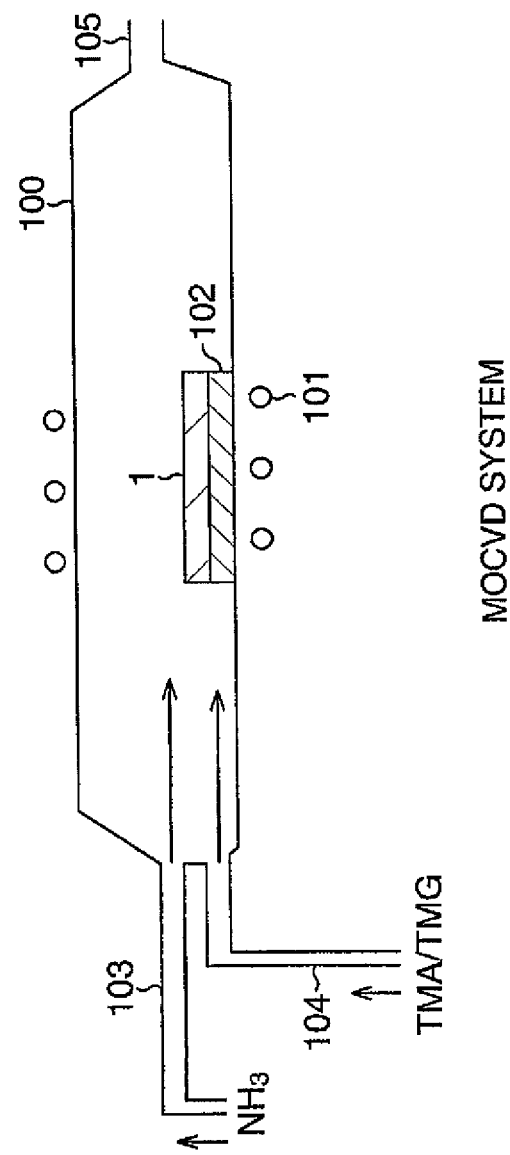
FIG. 6 is a diagram schematically illustrating a configuration of an MOCVD system used in the first embodiment.

Here, an MOCVD system as illustrated in FIG. 6 is used. In the MOCVD system, an RF coil 101 is wound around a reactor 100 made of quartz and a carbon susceptor 102 on which a substrate 1 is to be placed is disposed inside the reactor 100. Two gas inlet tubes 103 and 104 are connected to the upstream end of the reactor 100 (the end on the left-hand side of FIG. 6) to supply a source gas of a compound semiconductor. For example NH$_3$ gas is injected through the gas inlet tube 103 into the reactor 100 as a source gas of nitrogen (N). Organic compounds of group III such as trimethylaluminum (TMA), trimethylgallium (TMG), and trimethylindium (TMI) are injected into the reactor 100 through the gas inlet tube 104 as group-III element source gasses. Crystal growth is performed on the substrate 1 and excess gas is discharged to an exhaust gas cleaner through a gas outlet tube 105. It should be noted that if crystal growth by MOCVD is performed in a reduced-pressure atmosphere, the gas outlet tube 105 is connected to a vacuum pump and the outlet of the vacuum pump is connected to an exhaust gas cleaner.

The MOCVD system is used to deposit n-GaN, i-AlGaN, n-GaN and n$^+$-GaN on the substrate 1 in that order to form the first GaN layer 2, the first AlGaN layer 3, the second GaN layer 4 and the third GaN layer 5.

Since the mask 21 is formed on the substrate 1, n-GaN, i-AlGaN, n-GaN and n$^+$-GaN selectively grow only in exposed regions of the surface of the substrate 1.

To grow the n-GaN, n$^+$-GaN and i-AlGaN described above, mixed gas of trimethylaluminum (TMA) gas, which is the Al source, trimethylgallium (TMG) gas, which is the Ga source, and ammonium gas, which is the N source is used as the material gas. In addition, trimethilindium (TMI) gas, which is the In source, may be used as required. Supply and discontinuing supply of and the flow rates of the TMA gas, which is the Al source, and the TMG, which is the Ga source, are set as appropriate according to the compound semiconductor layers to grow. The flow rate of the ammonium gas, which is a material common to the layers, is set to a value in the range of approximately 10 slm to approximately 50 slm. The growth pressure is set to a value in the range of approximately 50 Torr to 300 Torr and the growth temperature is set to a value in the range of approximately 800° C. to approximately 1300° C. To grow n-GaN and n$^+$-GaN, a gas, for example SiH$_4$ gas, containing an n-type impurity, for example Si, is added to the material gas at a predetermined flow rate to dope with Si to predetermined concentrations.

The growth conditions under which i-AlGaN of the first AlGaN layer 3 is formed are set as follows, for example.

Flow rate of trimethylgallium (TMG): 0 to 50 sccm
Flow rate of trimethylaluminum (TMA): 0 to 50 sccm
Flow rate of trimethylindium (TMI): 0 to 50 sccm
Flow rate of ammonium (NH$_3$): 10 to 30 slm
Growth pressure: 100 Torr
Growth temperature: 1100° C.

Instead of this selective growth method, lithography and dry etching may be used to form a multilayer structure having the same shape as the multilayer of the first GaN layer 2, the first AlGaN layer 3, the second GaN layer 4 and the third GaN layer 5. In that case, n-GaN, i-AlGaN, n-GaN, and n$^+$-GaN are formed in layers on the entire surface of the substrate 1. The portions of the multilayer structure in which gate electrodes are to be formed are then removed by lithography and dry etching.

In this embodiment, n-GaN of the first GaN layer 2 has a thickness in the range of approximately 100 nm to approximately 10 μm, for example approximately 1000 nm, and is doped with Si, which is an n-type impurity, to a concentration of approximately $1\times10^{13}/cm^3$ to approximately $1\times10^{20}/cm^3$.

i-AlGaN of the first AlGaN layer 3 has a thickness of approximately 1 nm to approximately 10000 nm, for example approximately 200 nm and an Al composition ratio of 0.3 (30%). If the first AlGaN layer 3 is thinner than 1 nm, it will be difficult to achieve a sufficient normally-off operation, which can be achieved by the first AlGaN layer 3; If the first AlGaN layer 3 is thicker than 10000 nm, it will be difficult to provide a sufficiently high electron concentration during the on state. Therefore, the first AlGaN layer 3 is formed to a thickness in the range of approximately 1 nm to 10000 nm, so that a reliable normally-off operation and a sufficiently high electron density during an on operation can be achieved.

n-Gan of the second GaN layer 4 has a thickness in the range of approximately 1 nm to approximately 10 µm, for example 300 nm, and is doped with Si to a concentration of approximately $1\times10^{16}/cm^3$ to approximately $1\times10^{20}/cm^3$. If the second GaN layer 4 is thinner than 1 nm, a sufficient withstand voltage cannot be achieved; if the second GaN layer 4 is thicker than 10 on-state resistance will be larger and accordingly the current density in the on state will decrease. Therefore, the second GaN layer 4 is formed to a thickness in the range of approximately 1 nm to approximately 10 µm, so that a sufficient withstand voltage and a high current density can be achieved.

$n^+$-GaN of the third GaN layer 5 has a thickness in the range of approximately 10 nm to approximately 1000 nm, for example 200 nm, and is doped with Si to a concentration of approximately $1\times10^{15}/cm^3$ to approximately $1\times10^{20}/cm^3$, which is higher than the doping concentrations of the first and second GaN layers 2 and 4. Source electrodes are formed on and connected to the third GaN layer 5. The contact resistance with the source electrodes can be reduced by heavily doping the third GaN layer 5 with the conductive impurity.

After the formation of the first GaN layer 2, the first AlGaN layer 3, the second GaN layer 4 and the third GaN layer 5, the mask 21 is removed by wet etching or otherwise. As a result of the removal of the mask 21, an opening 10A that exposes a part of the surface of the substrate 1 is left in the multilayer structure of the first GaN layer 2, the first AlGaN layer 3, the second GaN layer 4 and the third GaN layer 5 have as illustrated in FIG. 5B.

Figure 5C:
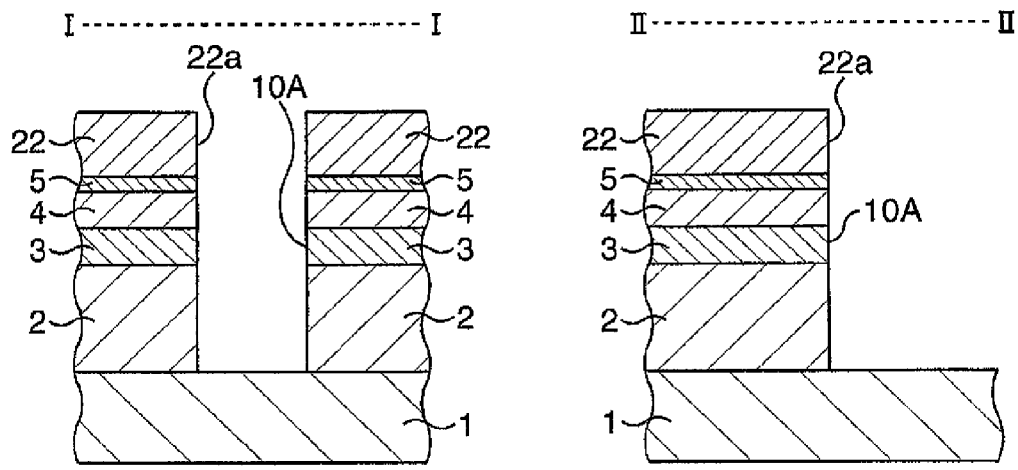
FIG. 5C is a schematic cross-sectional view illustrating the method for fabricating the AlGaN/GaN HEMT according to the first embodiment, continued from FIG. 5B.

Then, a mask 22 for selective growth is formed only on the upper surface of the third GaN layer 5 as illustrated in FIG. 5C.

Specifically, a mask material, here SiO, is deposited over the entire substrate 1 by CVD or otherwise to cover the first GaN layer 2, the first AlGaN layer 3, the second GaN layer 4 and the third GaN layer 5. Then SiO is processed by lithography and dry etching to left SiO only on the portion over the upper surface of the third GaN layer 5, thereby forming a mask 22 for selective growth. The mask 22 has an opening 22a that communicates with the opening 10A and has substantially the same shape as the opening 10A.

Figure 5D:
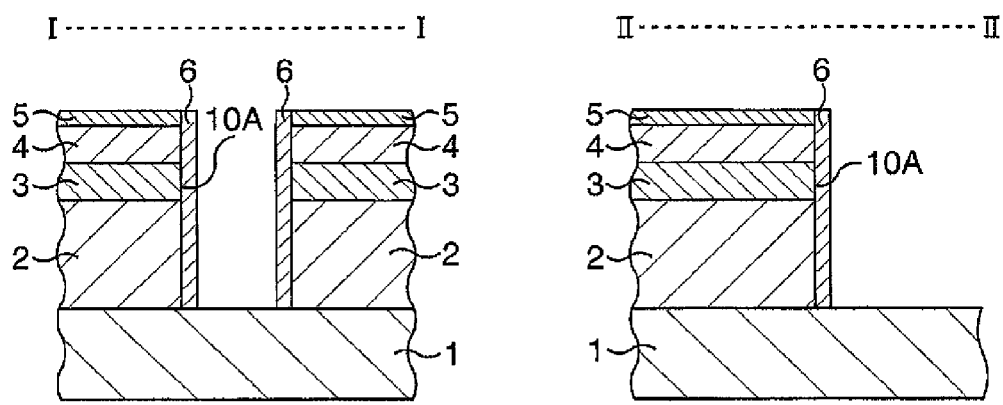
FIG. 5D is a schematic cross-sectional view illustrating the method for fabricating the AlGaN/GaN HEMT according to the first embodiment, continued from FIG. 5C.

Then a second AlGaN layer 6 is formed only on the sidewalls (inner sidewalls) of the opening 10A in the first GaN layer 2, the first AlGaN layer 3, the second GaN layer 4, and the third GaN layer 5 as illustrated in FIG. 5D.

Specifically, the MOCVD system described above is used to grow AlGaN under predetermined conditions with the mask 22 formed on the upper surface of the third GaN layer 5. That is, i-AlGaN is selectively grown under conditions that facilitate selective growth on (0001) surfaces, which are the sidewalls of the opening 10A in the first GaN layer 2, the first AlGaN layer 3, the second GaN layer 4 and the third GaN layer 5. The growth conditions include a growth pressure lower than the pressure in forming i-AlGaN of the first AlGaN layer 3 and a growth temperature higher than the temperature in forming i-AlGaN of the first AlGaN layer 3. In this embodiment, the mask 22 is formed in order to reliably prevent i-AlGaN from being formed on the third GaN layer 5.

The growth conditions under which i-AlGaN of the second AlGaN layer 6 is formed are set as follows, for example.

Flow rate of trimethylgallium (TMG): 0 to 50 sccm
Flow rate of trimethylaluminum (TMA): 0 to 50 sccm
Flow rate of trimethylindium (TMI): 0 to 50 sccm
Flow rate of ammonium ($NH_3$): 20 slm
Growth pressure: 40 Torr
Growth temperature: 1150° C.

Here, the mask 22 formed prevents i-AlGaN from growing on the surface of the third GaN layer 5. i-AlGaN may grow also on the bottom (inner bottom) of the opening 10A, which is the exposed region of the surface of the substrate 1. However, the growth poses no special problem because of the vertical HMET structure according to this embodiment. Therefore the mask 22 is formed only on the third GaN layer 5 in this embodiment. The selective growth is performed on the sidewalls, which are the (0001) surfaces, of the opening 10A in the first GaN layer 2, the first AlGaN layer 3, the second GaN layer 4 and the third GaN layer 5 to form the second AlGaN layer 6.

i-AlGaN of the second AlGaN layer 6 is the same as i-AlGaN of the first AlGaN layer 3. That is, i-AlGaN is approximately 1 nm to approximately 100 nm thick, here 20 nm, and has an Al composition ratio of 0.3 (30%), for example.

If the second AlGaN layer 6 is thinner than 1 nm, 2DEG having a sufficient concentration cannot be produced. If the second AlGaN layer 6 is thicker than 100 nm, a gate voltage Vgs cannot sufficiently be applied to the first GaN layer 2, the first AlGaN layer 3 and the second GaN layer 4. By forming the second AlGaN layer 6 to a thickness in the range of approximately 1 nm to approximately 100 nm, a sufficient gate voltage Vgs can be applied and 2DEG having a sufficient concentration can be produced.

After the second AlGaN layer 6 has been formed, the mask 22 is removed by wet etching or otherwise.

Figure 5E:
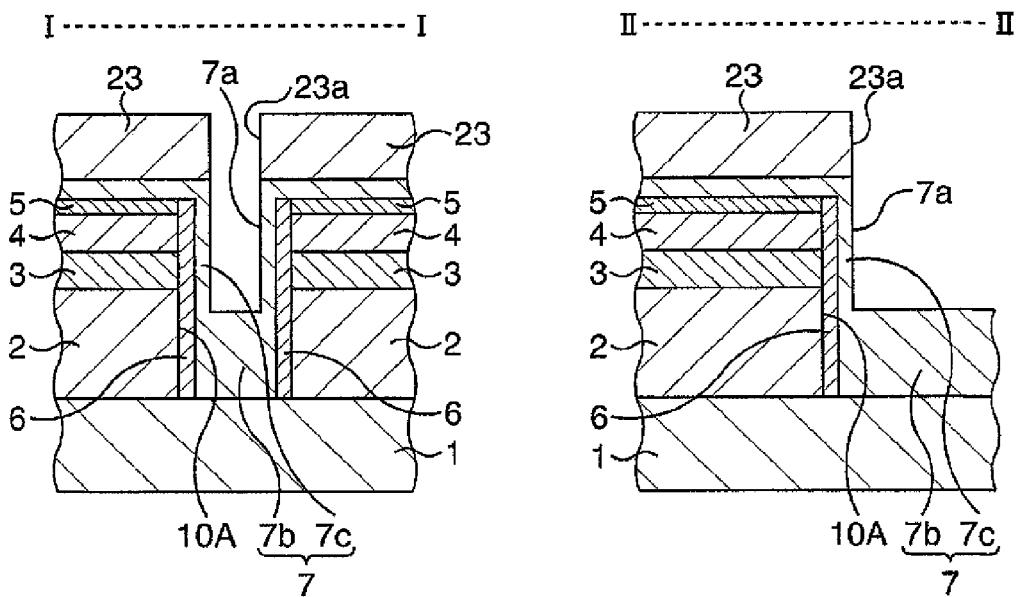
FIG. 5E is a schematic cross-sectional view illustrating the method for fabricating the AlGaN/GaN HEMT according to the first embodiment, continued from FIG. 5D.

Then, en insulating film 7, a part of which functions as a gate insulating film, is formed as illustrated in FIG. 5E.

Specifically, first an insulating film, for example SiN is deposited over the entire substrate 1 to cover the first GaN layer 2, the first AlGaN layer 3, the second GaN layer 4, the third GaN layer 5 and the second AlGaN layer 6. Here, a silicon nitride (SiN) film is deposited to a thickness of approximately 50 nm by plasma CVD. Atomic layer deposition (ALD) may be used instead of plasma CVD. An insulating film material selected from the group consisting of HfO, TaO and AlO may be used instead of SiN. It is also preferable to form the insulating film by depositing or otherwise providing layers of a plurality of materials selected from the group consisting of SiN, HfO, TaO and AlO.

The step-like (protruding) portions in SiN on the first GaN layer 2, the first AlGaN layer 3, the second GaN layer 4, the third GaN layer 5 and the second AlGaN layer 6 are planarized by chemical mechanical polishing (CMP), for example. A resist is applied on the entire SiN surface and is processed by lithography to form a resist mask 23 having an opening 23a in a region where a gate electrode is to be formed.

SiN is processed by dry etching with the resist mask 23 to form an electrode trench 7a in a region where a gate electrode is to be formed. The dry etching of SiN uses $SF_6$ gas, for example, as etching gas. With this, the insulating film 7 is completed. Because of the formation of the electrode trench 7a, the insulating film 7 is thicker in the portion 7b that covers the surface of the substrate 1 (the bottom of the electrode trench 7a) than the portion 7c that covers the second AlGaN layer 6 (the sidewall portions of the electrode trench 7a).

The portion 7c functions as a gate insulating film. An appropriate thickness as a gate insulating film is approximately 1 nm to approximately 100 nm, here approximately 20 nm.

The portion 7b is formed thicker than the portion 7c and thinner than or as thick as n-GaN of the first GaN layer 2 (here, approximately 1000 nm). If the thickness of the portion 7b is less than or equal to the thickness of the portion 7c, a sufficient withstand voltage cannot be achieved. On the other hand, if the portion 7b is thicker than n-GaN of the first GaN layer 2, the side surfaces of the first GaN layer 2 will not overlap the side surfaces of the portion 7c, which is the gate insulating film (with the second AlGaN layer 6 between them). Consequently, a voltage of the gate electrode formed along the gate insulating film may be insufficiently applied to the first GaN layer 2 and 2DEG with a desired concentration cannot be produced. Forming the portion 7b thicker than the portion 7c and thinner than or as thick as the first GaN layer 2 provides a sufficient distance between the gate electrode 8 and the drain electrode 11 to ensure a sufficient withstand voltage and also produce 2DEG with a desired high concentration.

Figure 4C:
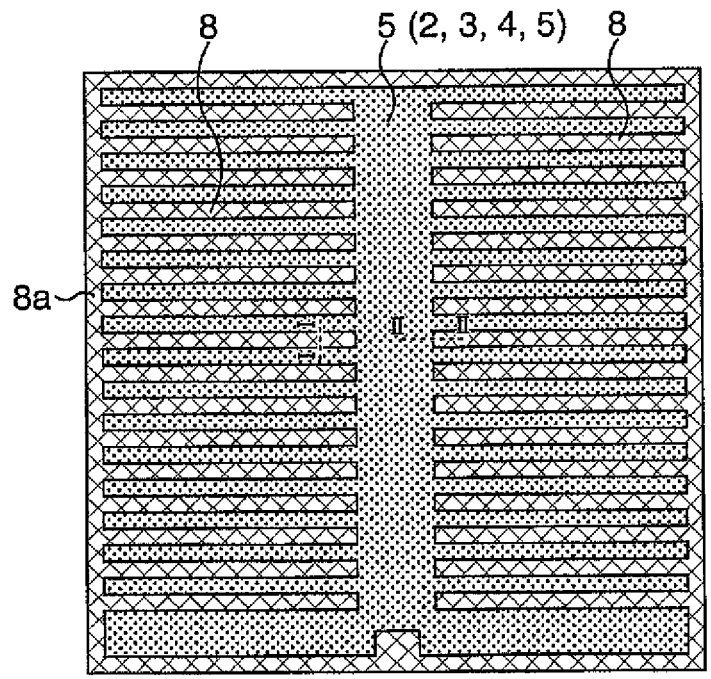
FIG. 4C is a schematic plan view illustrating the method for fabricating the AlGaN/GaN HEMT according to the first embodiment, continued from FIG. 4B.
Figure 5F:
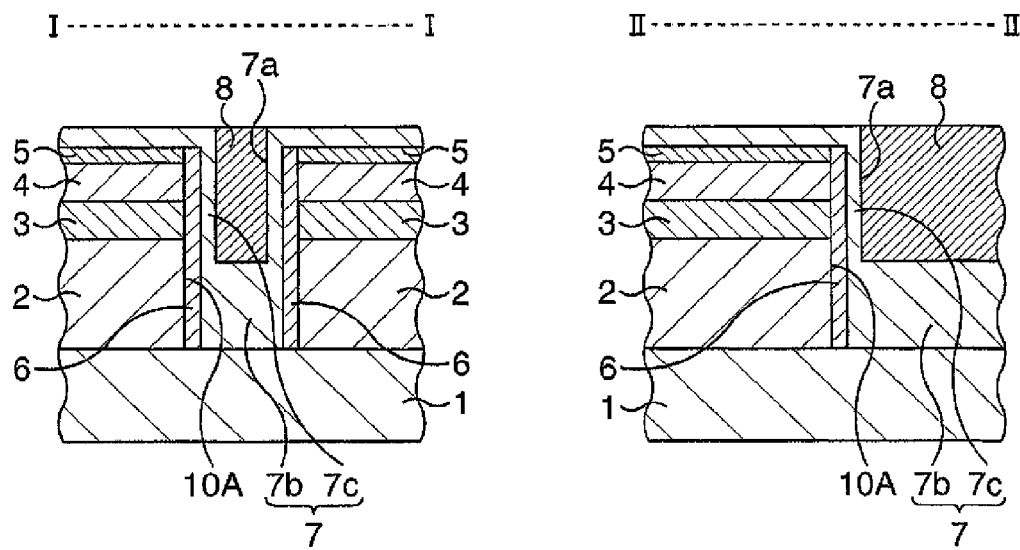
FIG. 5F is a schematic cross-sectional view illustrating the method for fabricating the AlGaN/GaN HEMT according to the first embodiment, continued from FIG. 5E.

Then, gate electrodes 8 are formed as illustrated in FIGS. 4C and 5F. For convenience of illustration, the second AlGaN layer 6 is omitted from FIG. 4C.

Specifically, the resist mask 23 used in the dry etching of SiN is used again to deposit electrode metals, for example Ni/Au. For example, vapor deposition is used to deposit Ni and Au in this order to a thickness sufficient to fill the electrode trench 7a. Then the resist mask 23 and the electrode metals on the resist mask 23 are removed by lift-off. In this way, the electrode metals fill the electrode trenches 7a to form a plurality of gate electrodes 8 in the shape of comb-teeth (in the shape of fingers) as illustrated in FIG. 4C. The gate electrodes 8 are formed in such a manner that one end of each gate electrode 8 is connected to a gate bus line 8a.

Figure 7:
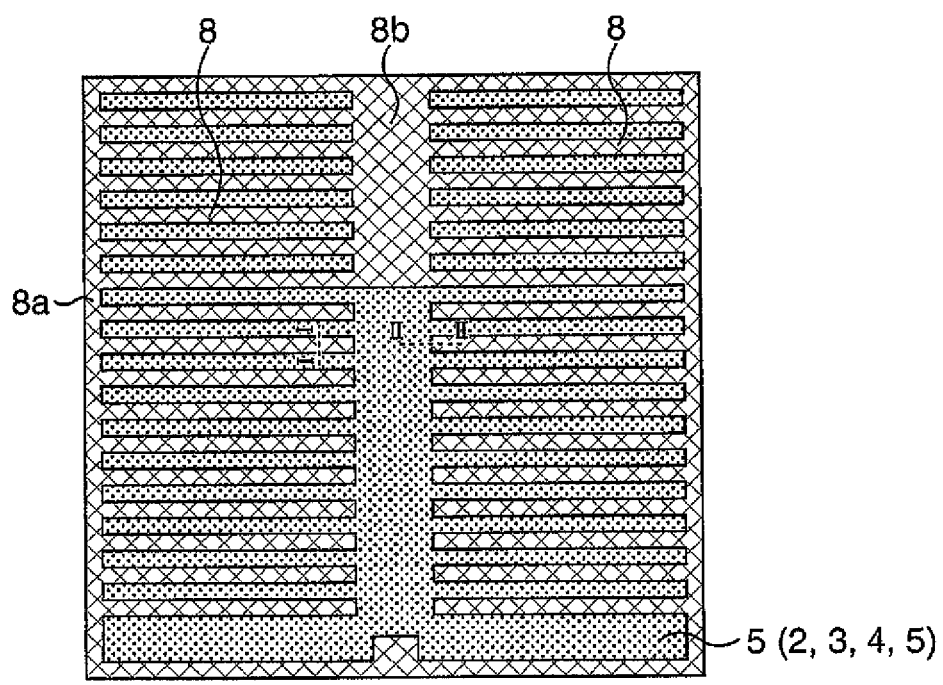
FIG. 7 is a schematic plan view illustrating an alternative exemplary configuration of a gate electrode of an AlGaN/GaN HEMT according to the first embodiment.

Instead of forming the gate electrode 8 and the gate bus line 8a as illustrated in FIG. 4C, a gate bus line 8b may be formed so as to connect some of the plurality of gate electrodes 8 at both ends of the gate electrodes 8 as illustrated in FIG. 7. A gate electrode 8 both ends of which are connected to the gate bus lines 8a, 8b transmits a signal faster than a gate electrode 8 one end of which is connected to the gate bus line 8a. Accordingly, the former electrode 8 can be used as an electrode that has to transmit a signal fast whereas the latter electrode 8 can be used as an electrode that does not have to transmit a signal very fast, depending on the intended use.

Figure 5G:
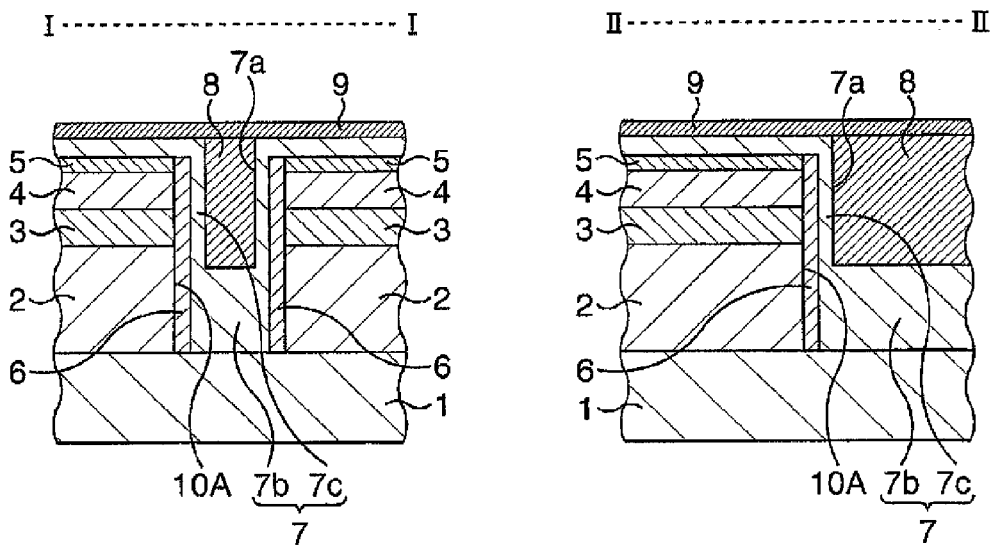
FIG. 5G is a schematic cross-sectional view illustrating the method for fabricating the AlGaN/GaN HEMT according to the first embodiment, continued from FIG. 5F.

Then, an interlayer insulating film 9 is formed as illustrated in FIG. 5G.

Specifically, an insulating film, here SiN is deposited over the entire substrate 1 by plasma CVD to a thickness of approximately 1000 nm to cover the exposed region of the gate electrode 8. Thus, the interlayer insulating film 9 is formed.

Figure 5H:
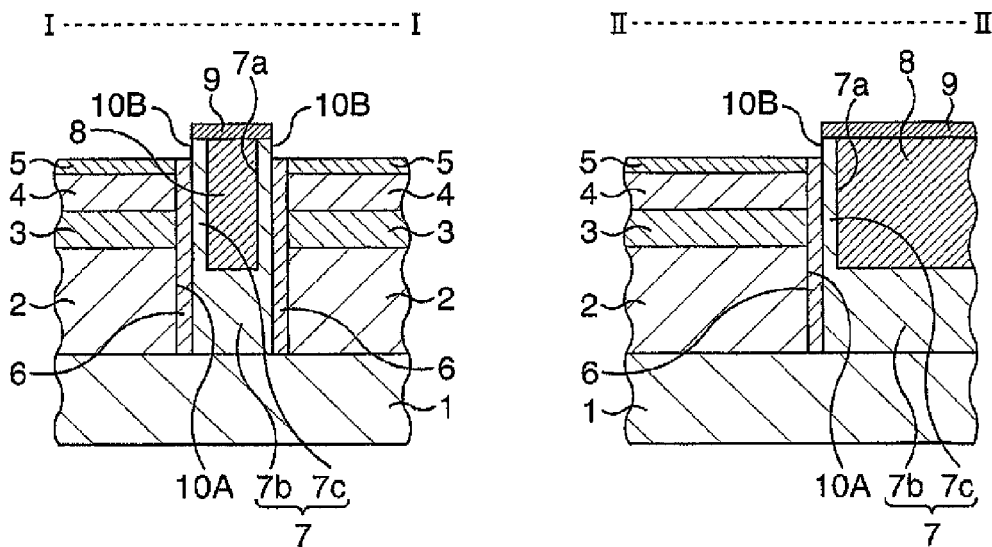
FIG. 5H is a schematic cross-sectional view illustrating the method for fabricating the AlGaN/GaN HEMP according to the first embodiment, continued from FIG. 5G.

Then openings 10B for connecting the electrode are formed in the insulating film 7 and the interlayer insulating film 9 as illustrated in FIG. 5h.

Specifically, portions of the insulating film 7 and the interlayer insulating film 9 that cover the third GaN layer 5 and the second AlGaN layer 6 are removed. As a result, openings 10B that expose the upper surface of the third GaN layer 5 and the upper surface of the second AlGaN layer 6 are formed.

Figure 4D:
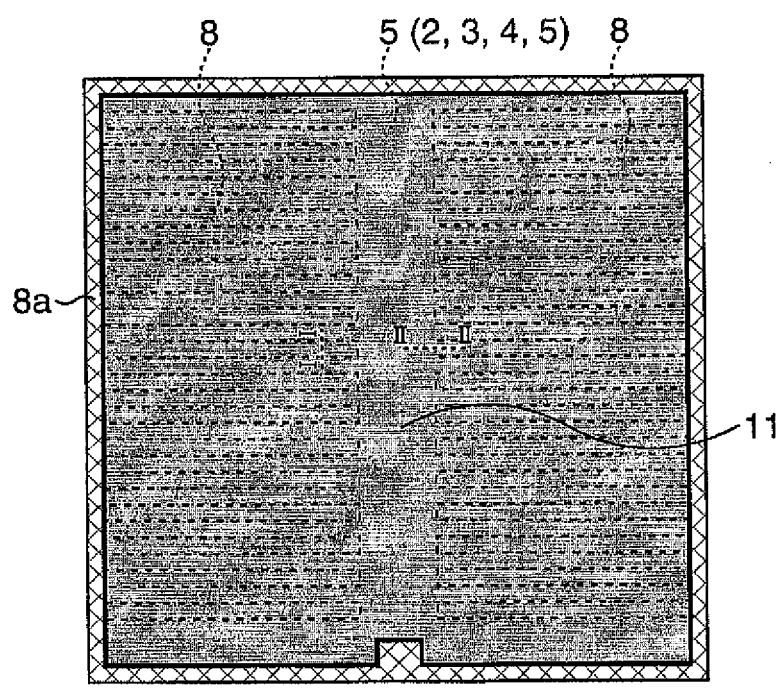
FIG. 4D is a schematic plan view illustrating the method for fabricating the AlGaN/GaN HEMT according to the first embodiment, continued from FIG. 4C.
Figure 5I:
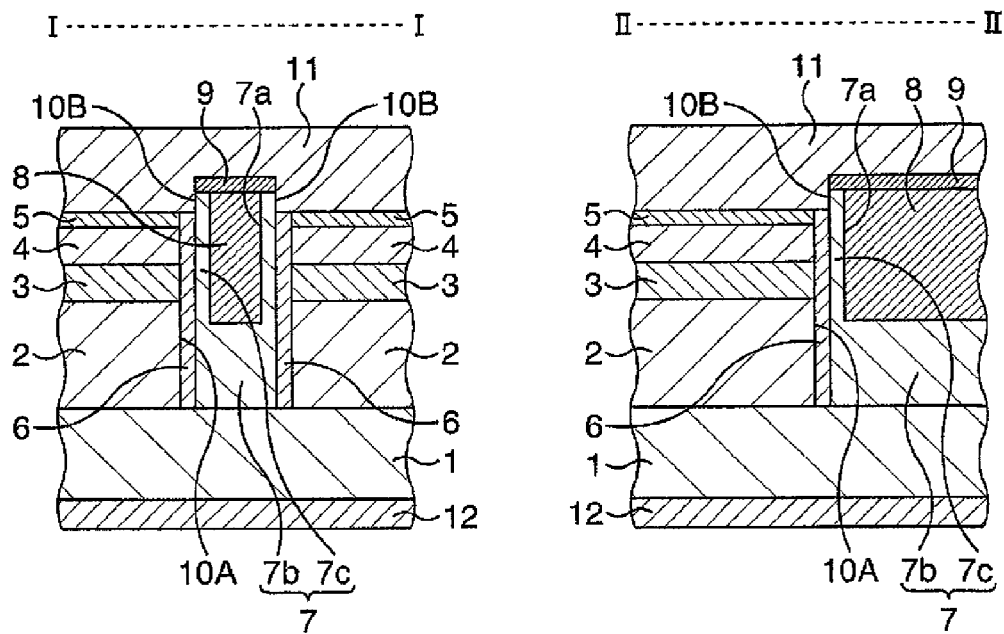
FIG. 5I is a schematic cross-sectional view illustrating the method for fabricating the AlGaN/GaN HEMT according to the first embodiment, continued from FIG. 5H.

Then, a source electrode 11 is formed on the top side of the substrate 1 as illustrated in FIGS. 4D and 5I. On the other hand, a drain electrode 12 is formed on the back side of the substrate 1 as illustrated in FIG. 5I. For convenience of illustration, the second AlGaN layer 6, the insulating film 7 and the interlayer insulating film 9 are omitted from FIG. 4D.

Specifically, first the back surface of the substrate 1 is polished or otherwise processed as needed to a desired thickness.

Electrode metals, for example Ta/Al are deposited on the top side of the substrate 1. That is, Ta and Al are deposited in this order by vapor deposition to entirely cover the top side of the substrate 1, thereby forming a source electrode 11. The opening 10B is filled with the electrode metals so that the electrode 11 is connected to the exposed surfaces of the third GaN layer 5 and the second AlGaN layer 6.

Electrode metals, for example Ta/Al are deposited on the bottom side of the substrate 1. That is, Ta and Al are deposited in this order by vapor deposition to entirely cover the back surface of the substrate 1, thereby forming a drain electrode 12.

Thereafter, steps such as the steps of forming predetermined interconnects to the source electrode 11 and the drain electrode 12 are performed to complete the vertical AlGaN/GaN HEMT according to this embodiment.

An experiment conducted on an AlGaN/GaN HEMT fabricated according to this embodiment will be described.

Figure 8:
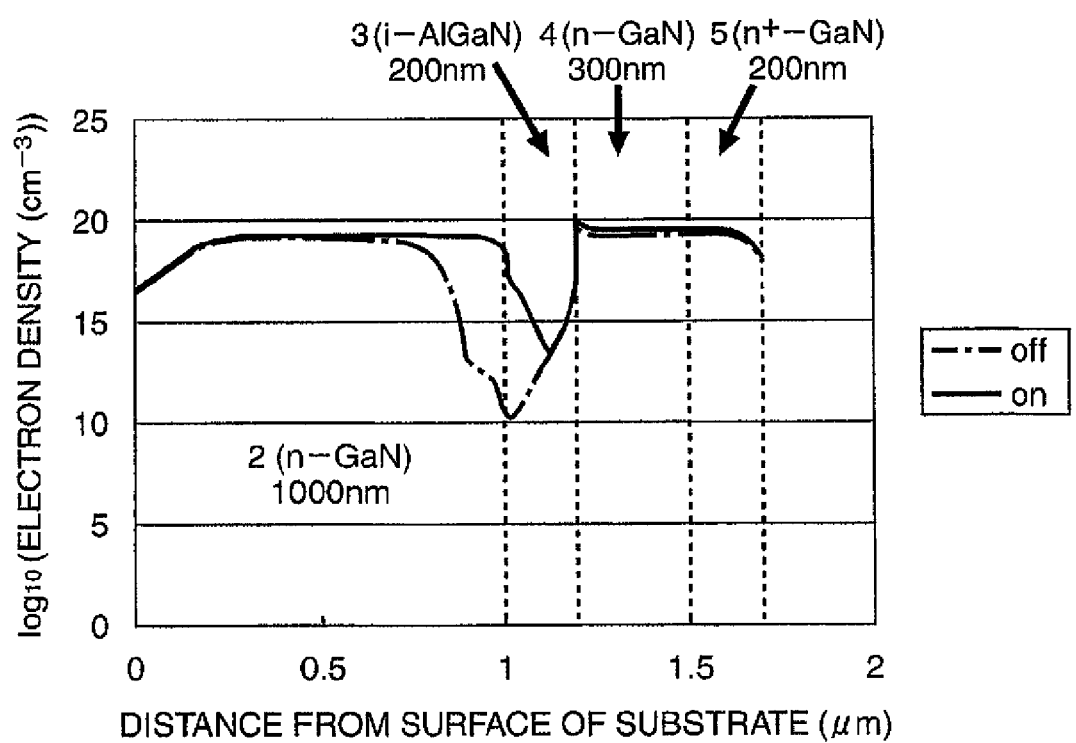
FIG. 8 is a characteristics diagram illustrating the relationship between electron density (per $cm^3$) and distance from the surface of the substrate of the AlGaN/GaN HEMT according to the first embodiment.

The relationship between electron density (per $cm^3$) and distance from the substrate 1 was studied in an AlGaN/GaN HEMT, The results of the experiment are shown in FIG. 8. In FIG. 8, the dashed line represents the relationship when power (gate voltage Vgs) is off (Vgs (=source-drain voltage Vds)=0 V) and the solid line represents the relationship when the power is on (Vgs (=Vds)=10 V).

When the power is off, the carrier density at the AlGaN/GaN hetero junction of the first AlGaN layer 3 decreases discontinuously. Such a carrier density distribution prevents current from flowing between the source electrode and the drain electrode when the voltage of the gate electrode is 0 V. When the power is on, carriers are attracted by an electric field applied from the gate electrode and therefore the carrier density in the first AlGaN layer 3, in which the carrier density was low when the power is off, is significantly higher than when the power is off. Therefore, whenever a predetermined voltage is applied to the gate electrode, a current flows between the source electrode and the drain electrode. This shows that on/off operations of the AlGaN/GaN HEMT is reliably accomplished.

Figure 9:
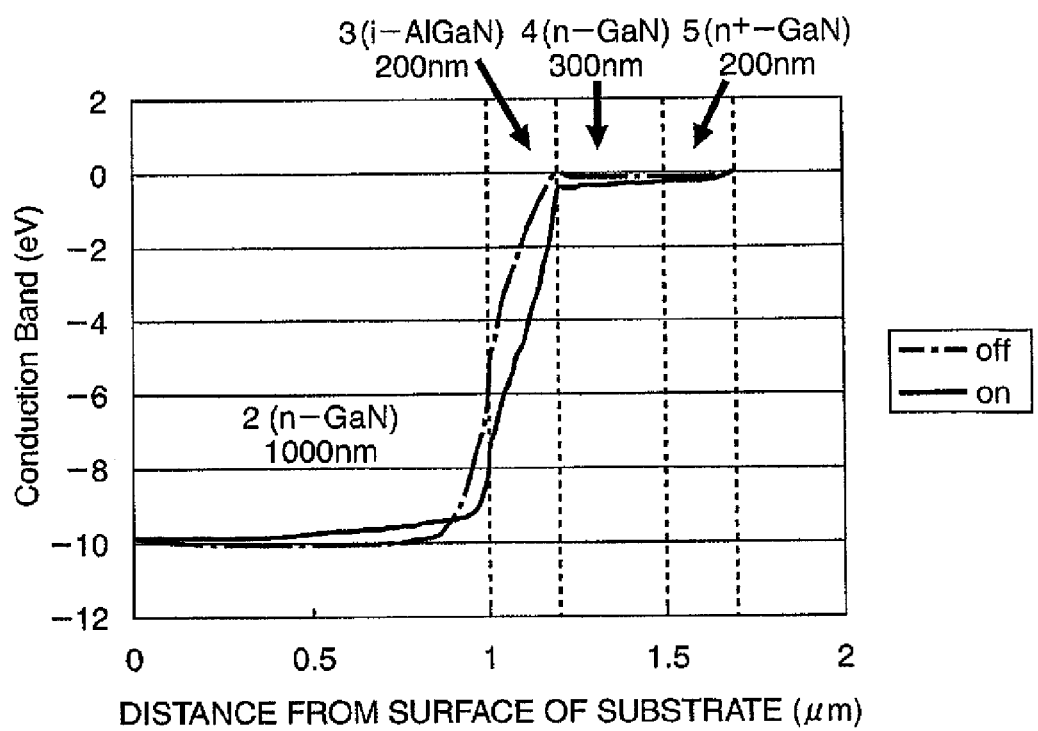
FIG. 9 is a characteristics diagram illustrating the relationship between conduction band (eV) in an energy band and the distance from the surface of the AlGaN/GaN HEMT according to the first embodiment.

The relationship between conduction band (eV) in an energy band and distance from the surface of the substrate 1 in AlGaN/GaN HEMT was studied. The results of the experiment are shown in FIG. 9. As in FIG. 8, the dashed line represents the relationship when the power is off (Vgs (=Vds) =0 V) and the solid line represents the relationship when the power is on (Vgs (=Vds)=10 V).

When the power is off, the conduction band in the first AlGaN layer 2 is higher than when the power is on. This means that electrons in the first AlGaN layer 2 when the power is off are significantly fewer in number than when the power is on. This shows that a normally-off operation of the AlGaN/GaN HEMT is reliably accomplished.

Figure 10:
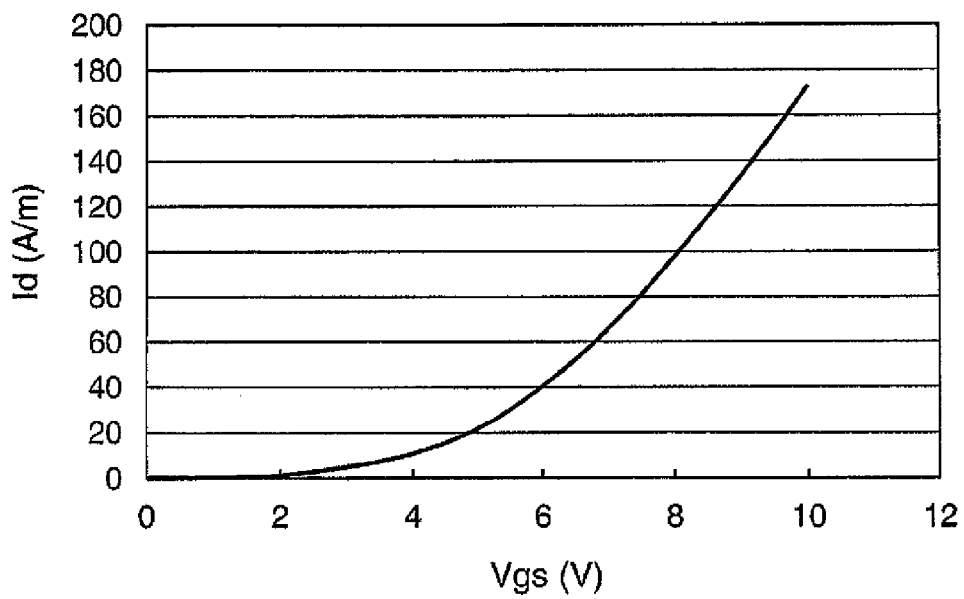
FIG. 10 is a characteristics diagram illustrating the relationship between drain current Id (A/m) and gate voltage Vgs (V) in the AlGaN/GaN HEMT according to the first embodiment.

The relationship between drain current Id (A/m) and gate voltage Vgs (V) in the AlGaN/GaN HEMT was studied. The result of the experiment is shown in FIG. 10. In FIG. 10, Vds is set to 10 V. As shown, when Vgs=0 V, Id=0 and a good normally-off operation is achieved. It can be seen that Id increases with increasing Vgs as desired. This shows that the AlGaN/GaN HEMT according to this embodiment achieves a normally-off operation and has good device characteristics as a vertical HEMT.

Figure 11:
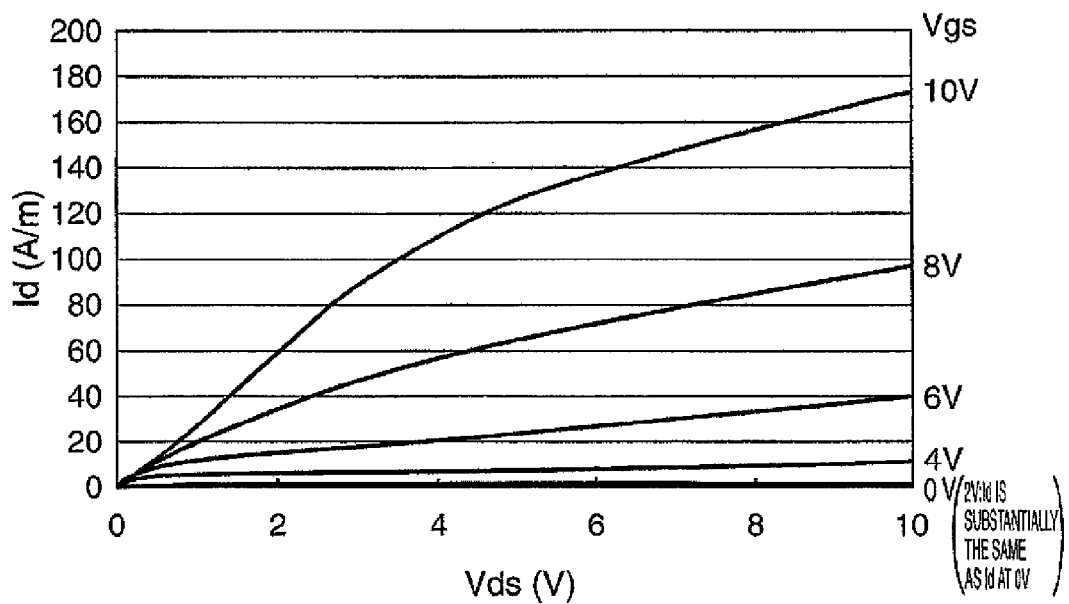
FIG. 11 is a characteristics diagram illustrating the relationship between drain current Id (A/m) and drain-source voltage Vds (V) in the AlGaN/GaN HEMT according to the first embodiment.

The relationship between drain current I (A/m) and drain-source voltage Vds (V) in the AlGaN/GaN HEMT was studied. The results of the experiment are shown in FIG. 11. In FIG. 11, gate voltage Vgs is set to 0 V, 2V, 4 V, 6 V, 8 V and 10 V. As shown, when Vgs=0 V, Id=0 regardless of the value of Vds. Thus, a proper normally-off operation is achieved. It can be seen that Id increases with increasing Vds as desired. This shows that the AlGaN/GaN HEMT according to this embodiment achieves a normally-off operation and has good device characteristics as a vertical HEMT.

As has been described above, according to this embodiment, a reliable vertical HEMT is implemented that can achieve a sufficiently high withstand voltage and high output without problems that could otherwise result from the use of a p-type compound semiconductor such as p-GaN. Furthermore, in the vertical HEMT, a normally-off operation in which no current flows between the source electrode 11 and the drain electrode 12 when a voltage is not applied to the gate electrode 8 can be accomplished and on/off of the transistor can be properly controlled.

Variations

Variations of the first embodiment will be described below.

(First Variation)

In a first variation, a vertical AlGaN/GaN HEMT is fabricated in the same way as in the first embodiment, except that a source electrode is formed prior to formation of a gate electrode.

FIGS. 12A to 12E are schematic cross-sectional views illustrating principal steps of a method for fabricating an AlGaN/GaN HEMT according to the first variation of the first embodiment.

First, the steps in FIGS. 5A to 5D are performed in the same way as in the first embodiment.

Figure 12A:
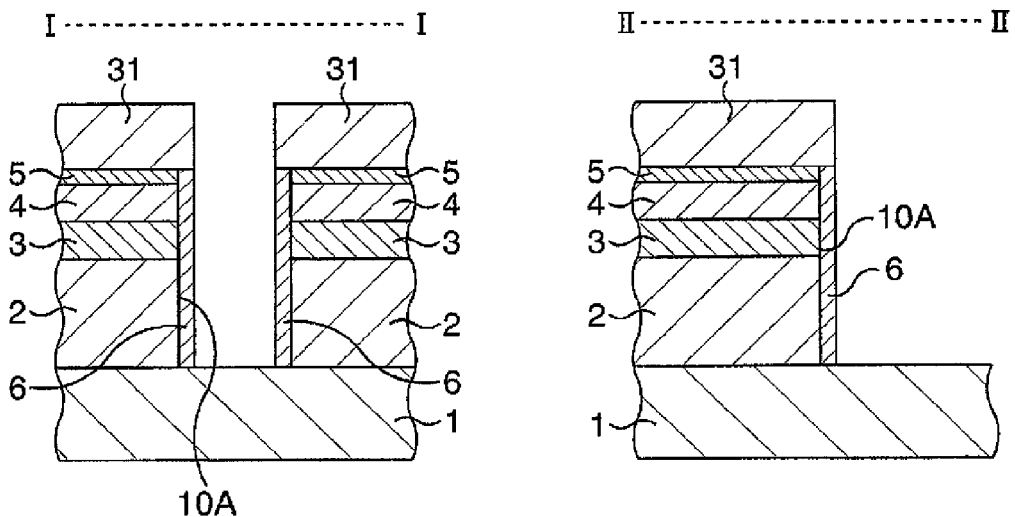
FIG. 12A is a schematic cross-sectional view illustrating principal steps of a method for fabricating an AlGaN/GaN HEMT according to a first variation of the first embodiment.

Then, a source electrode 31 is formed on the top side of the substrate 1 as illustrated in FIG. 12A.

Specifically, a resist is applied over the entire substrate 1 and is processed by lithography to form a resist mask having an opening that exposes the upper surface of the third GaN layer 5 and the upper surface of the second AlGaN layer 6. Electrode metals, for example Ta and Al are deposited in this order by vapor deposition to cover the entire surface of the substrate 1. The resist mask and the electrode metals on the resist mask are removed by lift-off. Thus, a source electrode 31 which is connected to the exposed surfaces of the third GaN layer 5 and the second AlGaN layer 6 is formed.

Figure 12B:
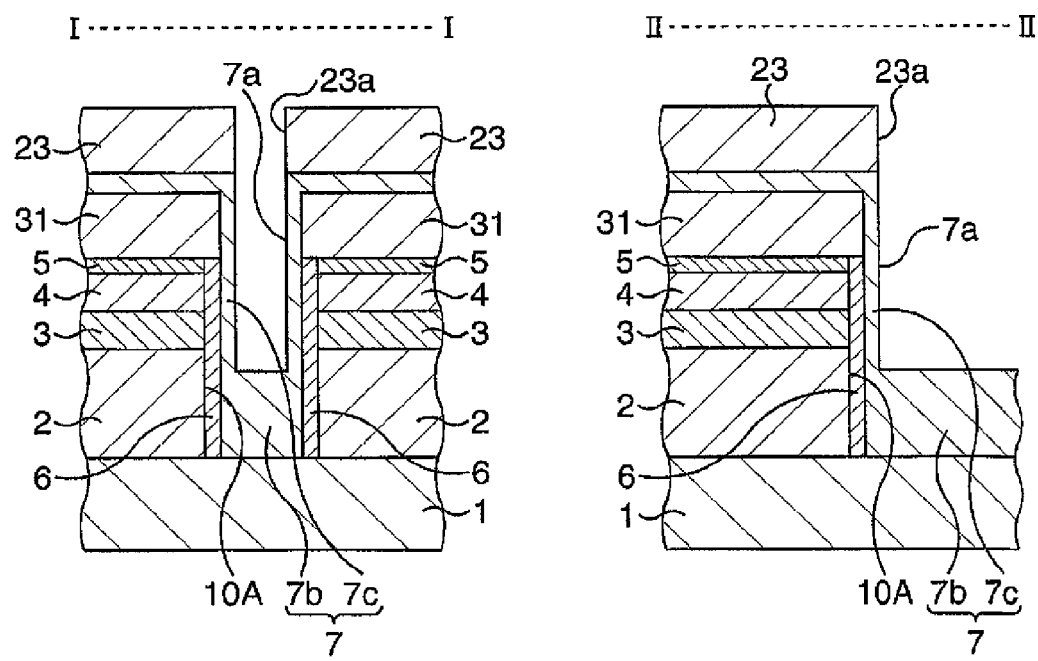
FIG. 12B is a schematic cross-sectional view illustrating principal steps of the method for fabricating the AlGaN/GaN HEMT according to the first variation of the first embodiment, continued from FIG. 12A.

Then, an insulating film 7 a part of which functions as a gate insulating film is formed over the entire substrate 1 as illustrated in FIG. 12B.

Specifically, first an insulating film, for example SiN is deposited over the entire surface of the substrate 1 to cover the first GaN layer 2, the first AlGaN layer 3, the second GaN layer 4, the third GaN layer 5, the second AlGaN layer 6, and the source electrode 31. Here, for example SiN is deposited to a thickness of approximately 50 nm by plasma CVD. ALD may be used instead of plasma CVD. An insulating film material selected from the group consisting of HfO, TaO and AlO may be used instead of SiN. It is also preferable to form the insulating film by depositing or otherwise providing layers of a plurality of materials selected from the group consisting of SiN, HfO, TaO and AlO.

The step-like (protruding) portions in SiN are planarized by CMP, for example. A resist is applied on the entire surface of SiN and is processed by lithography to form a resist mask 23 having an opening 23a in a region where a gate electrode is to be formed.

SiN is processed by dry etching with the resist mask 23 to form an electrode trench 7a in a region where a gate electrode is to be formed. With this, the insulating film 7 is completed. Because of the formation of the electrode trench 7a, the portion 7b that covers the surface of the substrate 1 (the bottom of the electrode trench 7a) is thicker than the portion 7c that covers the second AlGaN layer 6. The thicknesses of the portions 7b and 7c are the same as those in the first embodiment.

Figure 12C:
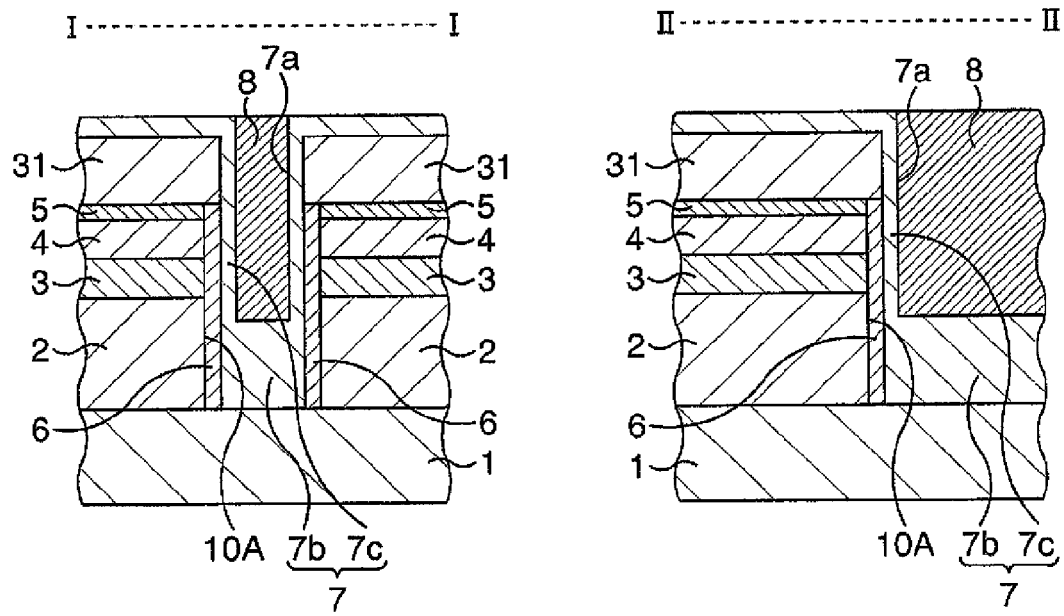
FIG. 12C is a schematic cross-sectional view illustrating principal steps of the method for fabricating the AlGaN/GaN HEMT according to the first variation of the first embodiment, continued from FIG. 12B.

Then, a gate electrode 8 is formed as illustrated in FIG. 12C.

Specifically, the resist mask 23 used in the dry etching of SiN is used again to deposit electrode metals, for example Ni and Au to a thickness sufficient to fill the electrode trench 7a by vapor deposition, for example. Then the resist mask 23 and the electrode metals on the resist mask 23 are removed by lift-off. In this way, the electrode metals fill the electrode trenches 7a to form a plurality of gate electrodes 8 in the shape of comb-teeth.

Figure 12D:
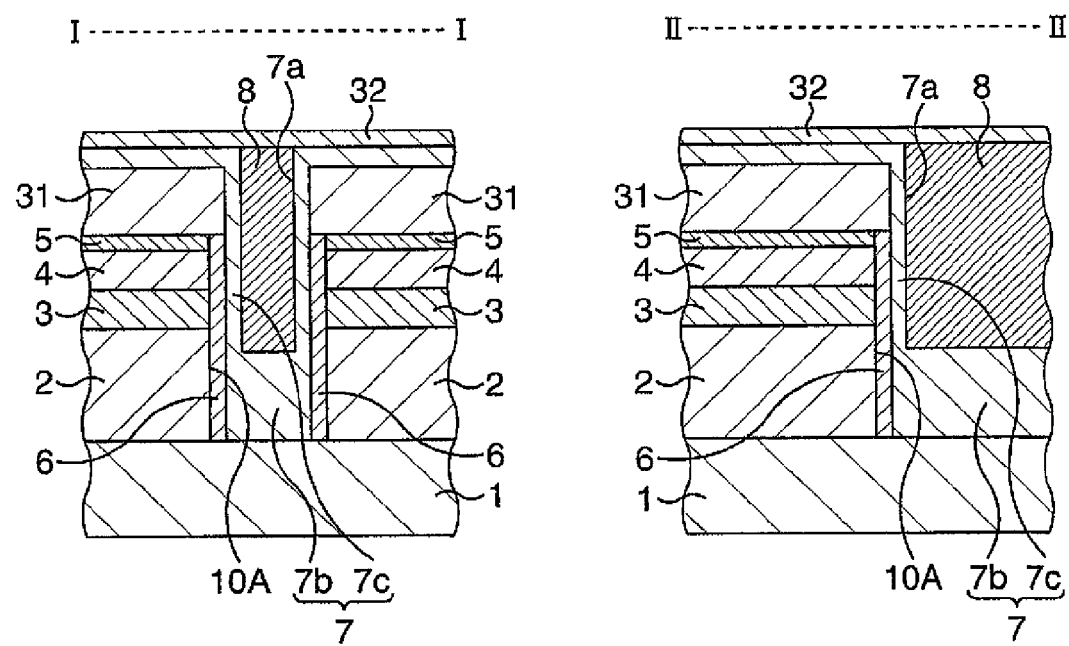
FIG. 12D is a schematic cross-sectional view illustrating principal steps of the method for fabricating the AlGaN/GaN HEMT according to the first variation of the first embodiment, continued from FIG. 12C.

Then, an interlayer insulating film 32 is formed as illustrated in FIG. 12D.

Specifically, an insulating film, here SiN is deposited over the entire substrate 1 by plasma CVD to a thickness of approximately 1000 nm to cover the exposed region of the gate electrode B. Thus, the interlayer insulating film 32 is formed.

Figure 12E:
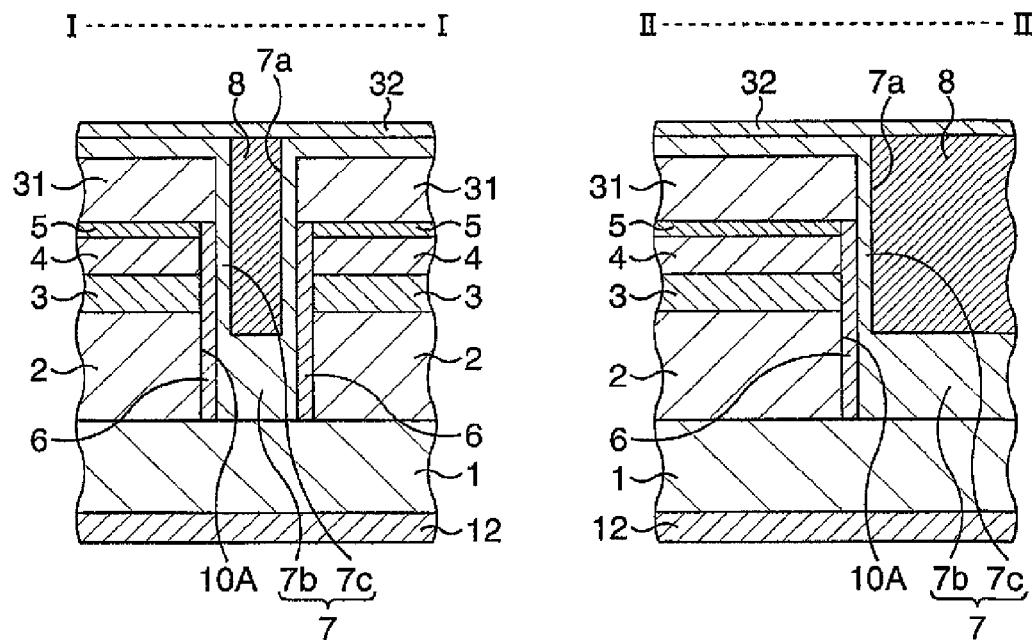
FIG. 12E is a schematic cross-sectional view illustrating principal steps of the method for fabricating an AlGaN/GaN HEMT according to the first variation of the first embodiment, continued from FIG. 12D.

Then, a drain electrode 12 is formed on the bottom side of the substrate 1 as illustrated in FIG. 12E.

Specifically, first the back surface of the substrate 1 is polished as needed to a desired thickness of the substrate 1.

Ta and Al are deposited on the bottom side of the substrate 1 in this order by vapor deposition to cover the entire surface of the bottom side of the substrate 1, thereby forming a drain electrode 12.

Thereafter, steps such as the steps of forming predetermined interconnects to the source electrode 31 and the drain electrode 12 are performed to complete the vertical AlGaN/GaN HEMT according to this variation.

As has been described above, according to this embodiment, a miniaturizable, reliable vertical RENT is implemented that can achieve a sufficiently high withstand voltage and high output without problems that could otherwise result from the use of a p-type compound semiconductor such as p-GaN. Furthermore, in the vertical HEMT, a normally-off operation in which no current flows between the source electrode 31 and the drain electrode 12 when a voltage is not applied to the gate electrode 8 can be accomplished and on/off of the transistor can be properly controlled.

(Second Variation)

In a second variation, a vertical AlGaN/GaN HEMT is fabricated in the same way as in the first embodiment, except that an insulating film that includes an electrode trench for a gate electrode and functions as a gate insulating film is formed in two steps.

FIGS. 13A to 13D are schematic cross-sectional views illustrating principal steps of a method for fabricating the AlGaN/GaN HEMT according to the second variation of the first embodiment.

First, the steps in FIGS. 5A to 5D are performed in the same way as in the first embodiment.

Figure 13A:
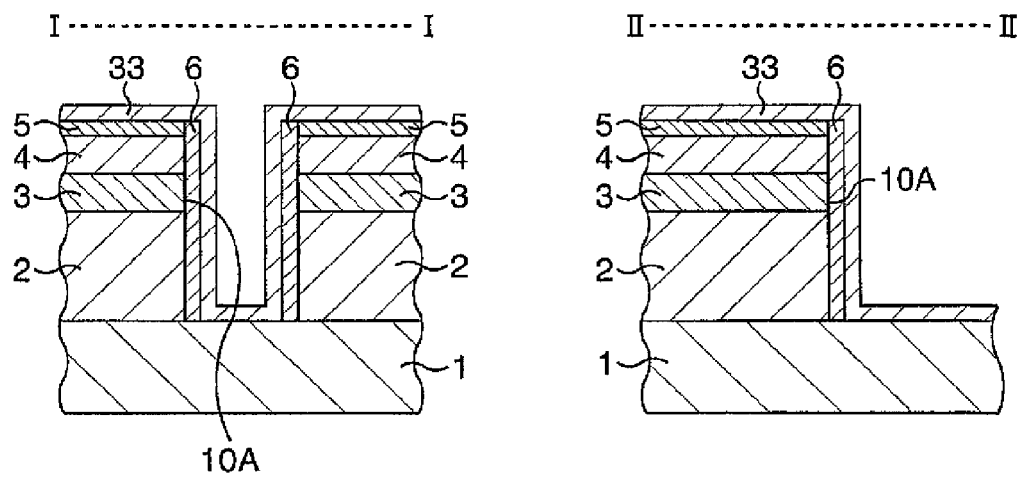
FIG. 13A is a schematic cross-sectional view illustrating principal steps of a method for fabricating an AlGaN/GaN HEMT according to a second variation of the first embodiment.

Then, a thin first insulating film 33 is formed as illustrated in FIG. 13A.

Specifically, an insulating film, for example SiN is deposited over the entire surface of the substrate 1 to cover the first GaN layer 2, the first AlGaN layer 3, the second GaN layer 4, the third GaN layer 5, and the second AlGaN layer 6. Here, SiN is deposited anisotropically by plasma CVD to a thickness desirable as a gate insulating film. For example, the thickness is approximately 1 nm to approximately 100 nm, here approximately 20 nm. SiN is deposited to cover the third GaN layer 5, the second AlGaN layer 6 and exposed portions of the surface of the substrate 1 to form the first insulating film 33. ALD may be used instead of plasma CVD. The first insulating film 33 may be made of one material selected from the group consisting of HfO, TaO and AlO, instead of SiN. It is also preferable to form the insulating film by depositing or otherwise providing layers of a plurality of materials selected from the group consisting of SiN, HfO, TaO and AlO to form the first insulating film 33.

Figure 13B:
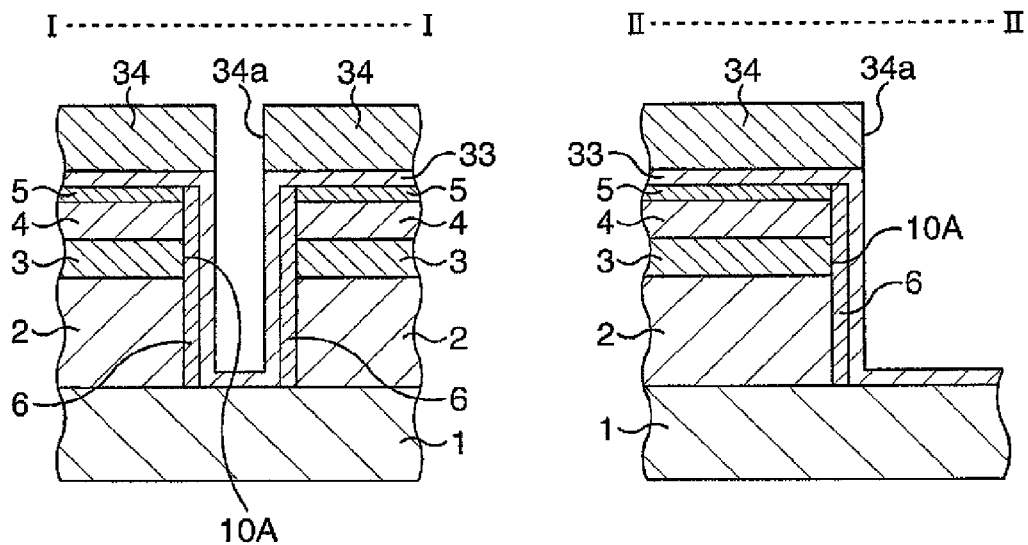
FIG. 13B is a schematic cross-sectional view illustrating principal steps of the method for fabricating the AlGaN/GaN HEMT according to the second variation of the first embodiment, continued from FIG. 13A.

Then, a resist mask 34 is formed as illustrated in FIG. 13B.

Specifically, a resist is applied over the entire surface of the first insulating film 33 and is processed by lithography to form a resist mask 34 including an opening 34a in a region where a gate electrode is to be formed.

Figure 13C:
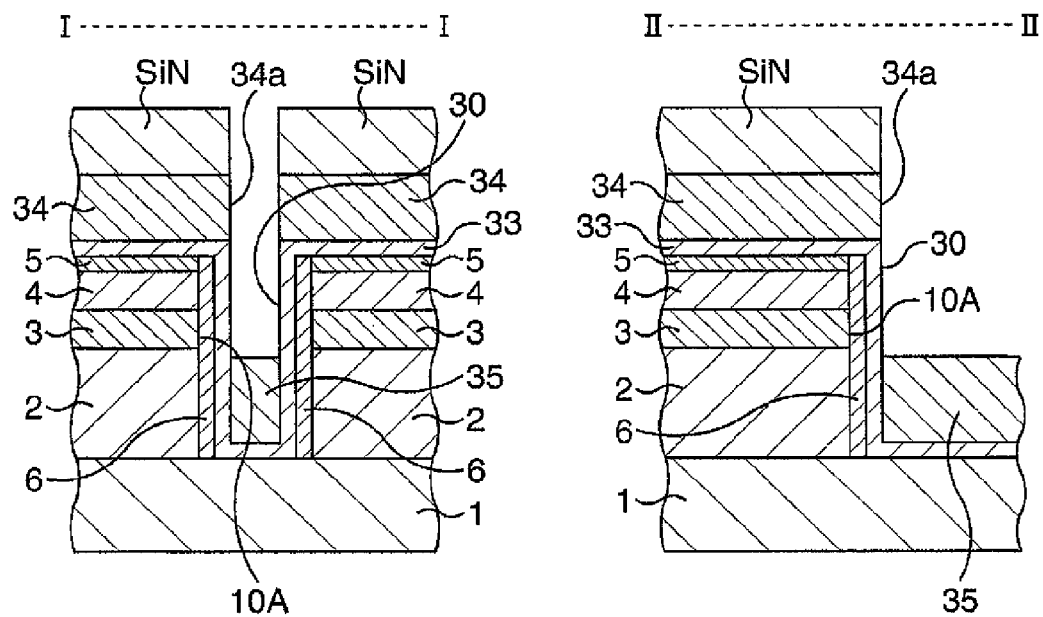
FIG. 13C is a schematic cross-sectional view illustrating principal steps of the method for fabricating the AlGaN/GaN HEMT according to the second variation of the first embodiment, continued from FIG. 13B.

Then, a second insulating film 35 is formed as illustrated in FIG. 13C.

Specifically, an insulating film, for example SiN is deposited over the entire surface of the substrate 1 with the resist mask 34. Here, sputtering is used to anisotropically deposit SiN. SiN is deposited on the bottom of the first insulating film 33 exposed in the opening 34a to form the second insulating film 35. SiN is also deposited on the resist mask 34. The material of the second insulating film 35 may be one material selected from the group consisting of HfO, TaO and AlO, instead of SiN. It is also preferable to deposit or otherwise form layers of a plurality of materials selected from the group consisting of SiN, HfO, TaO and AlO.

The first insulating film 33 and the second insulating film 35 together form an electrode trench 30 in a portion where a gate electrode is to be formed. The first insulating film 33 functions as a gate insulating film.

The second insulating film 35 formed on the first insulating film 33 adds the thickness to the first insulating film 33. The thickness of the layered portion formed is less than or equal to the thickness of n-GaN of the first GaN layer 2 (approximately 1000 nm here). If the layered portion is thicker than n-GaN of the first GaN layer 2, the side surfaces of the first AlGaN layer 3 will not overlap the side surfaces of the first insulating film 33, which is the gate insulating film (with the second AlGaN layer 6 between them). Consequently, a voltage of the gate electrode formed along the gate insulating film may be insufficiently applied to the first GaN layer 2 and 2DEG with a desired concentration cannot be produced. Since the layered portion is thicker than the first insulating film 33 by the thickness of the second insulating film 35, a sufficient distance is provided between the gate electrode and the drain electrode to ensure a sufficient withstand voltage.

In this way, according to this variation, the layered portion is formed to a thickness less than or equal to the thickness of n-GaN of the first GaN layer 2, a sufficient distance is provided between the gate electrode and the drain electrode to ensure a sufficient withstand voltage and allows 2DEG with a desired high concentration to be produced.

Figure 13D:
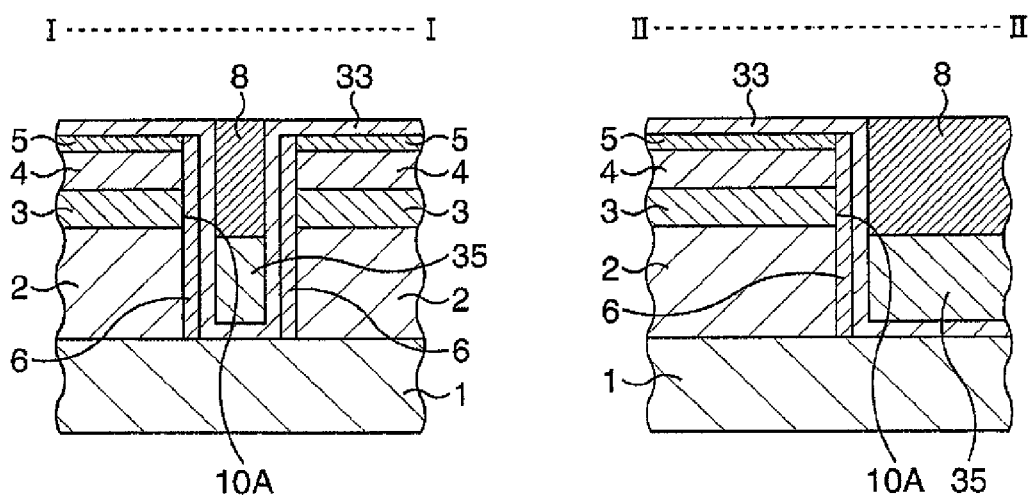
FIG. 13D is a schematic cross-sectional view illustrating principal steps of the method for fabricating the AlGaN/GaN HEMT according to the second variation of the first embodiment, continued from FIG. 13C.

Then a gate electrode 8 is formed as illustrated in FIG. 13D.

Specifically, the resist mask 34 used in the dry etching of SiN is used again to deposit electrode metals, for example Ni/Au. Specifically, Ni and Au are deposited in this order by sputtering to a thickness sufficient to fill the electrode trench 30. Then the resist mask 34 and SiN and the electrode metals on the resist mask 34 are removed by lift-off. In this way, the electrode trench 30 is filled with the electrode metals to form a gate electrode 8.

Then, the same steps in FIGS. 5G to 5I are performed.

Thereafter, steps such as the steps of forming predetermined interconnects to the source electrode 11 and the drain electrode 12 are performed to complete the vertical AlGaN/GaN HEMT according to this variation.

As has been described above, according to this embodiment, a, reliable vertical HEMT is implemented that can achieve a sufficiently high withstand voltage and high output without problems that could otherwise result from the use of a p-type compound semiconductor such as p-GaN. Furthermore, in the vertical HEMT, a normally-off operation in which no current flows between the source electrode 11 and the drain electrode 12 when a voltage is not applied to the gate electrode 8 can be accomplished and on/off of the transistor can be properly controlled.

Second Embodiment

In a second embodiment, a power supply device including vertical AlGaN/GaN HEMTs according to the first embodiment will be disclosed.

Figure 14:
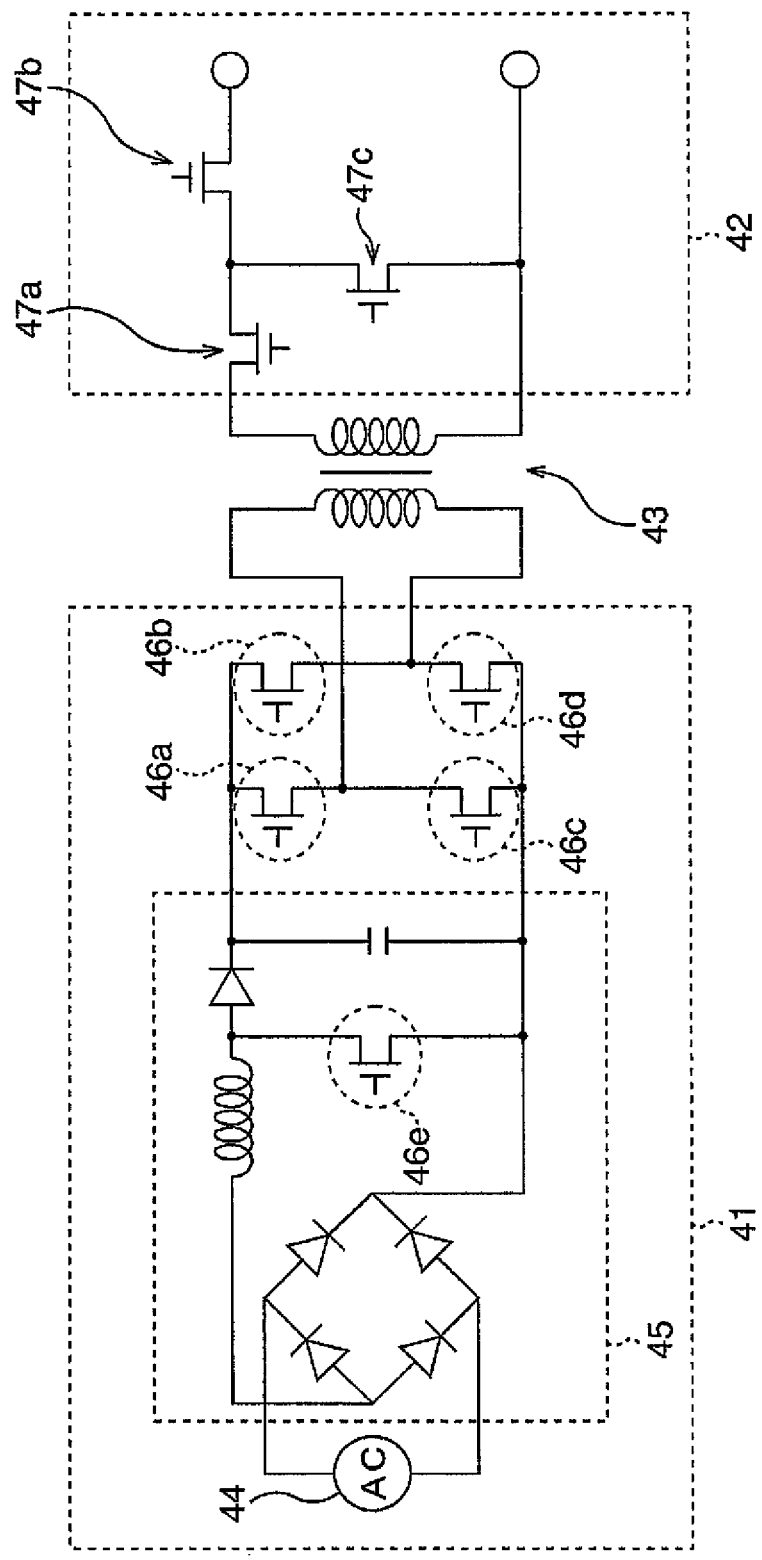
FIG. 14 is a connection diagram schematically illustrating a configuration of a power supply device according to a second embodiment.

FIG. 14 is a connection diagram schematically illustrating a configuration of the power supply device according to the second embodiment.

The power supply device according to this embodiment includes a high-voltage primary circuit 41, a low-voltage secondary circuit 42, and a transformer 43 disposed between the primary circuit 41 and the secondary circuit 42.

The primary circuit 41 includes an alternating-current power supply 44, a so-called bridge rectifier circuit 45, a plurality of (four in this example) switching elements 46a, 46b, 46c and 46d. The bridge rectifier circuit 45 includes a switching element 46e.

The secondary circuit 42 includes a plurality of (three in this example) switching elements 47a, 47b and 47c.

In this embodiment, the switching element 46a, 46b, 46c, 46d and 46e of the primary circuit 41 are vertical HEMTs according to the first embodiment. The switching elements 47a, 47b and 47c of the secondary circuit 42, on the other hand, are conventional silicon-based MIS FETs.

In this embodiment, reliable vertical HEMTs which have a sufficiently high withstand voltage and high output power and are capable of a desired normally-off operation without problems that could otherwise result from the use of a p-type compound semiconductor such as p-GaN are applied to a high-voltage circuit. Consequently, a reliable high-power power supply circuit is implemented.

Third Embodiment

In a third embodiment, a high-frequency amplifier including a vertical AlGaN/GaN HEMT according to the first embodiment will be disclosed.

Figure 15:
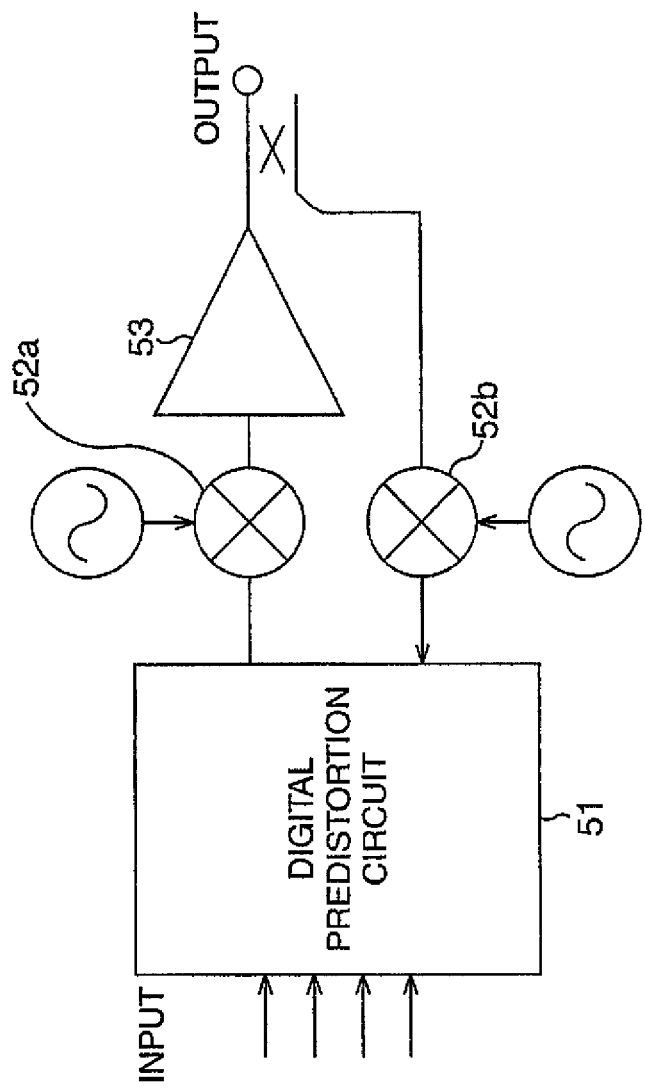
FIG. 15 is a connection diagram schematically illustrating a configuration of a high-frequency amplifier according to a third embodiment.

FIG. 15 is a connection diagram schematically illustrating a configuration of the high-frequency amplifier according to the third embodiment.

The high-frequency amplifier according to this embodiment is applicable to a power amplifier in a base station for mobile phones. The high-frequency amplifier includes a digital predistortion circuit 51, mixers 52a, 52b and a power amplifier 53.

The digital predistortion circuit 51 compensates for non-linear distortion of an input signal. The mixer 52a mixes an input signal whose linear distortion has been compensated for with an AC signal. The power amplifier 53 amplifies an input signal mixed with an AC signal and includes a vertical HEMT according to the first embodiment. It should be noted that in FIG. 15, a switching operation of a switch, for example, enables an output signal to be mixed with the AC signal at the mixer 52b and sent back to the digital predistortion circuit 51.

In this embodiment, a reliable vertical HEMT which has a sufficiently high withstand voltage and high output power and is capable of a desired normally-off operation without problems that could otherwise result from the use of a p-type compound semiconductor such as p-GaN are applied to a high-frequency amplifier. Consequently, a reliable high-withstand-voltage high-frequency amplifier is implemented.

Any of the present embodiments can implement of a miniaturizable, reliable vertical compound semiconductor device having a sufficiently high withstand voltage and high output power and being capable of a normally-oft operation without problems that could otherwise result from the use of a p-type compound semiconductor. The vertical compound semiconductor device can be commercialized as a device contained in a component of a machine such as an automobile.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A compound semiconductor device comprising:
   a first electrode;
   a compound semiconductor layer which is formed above the first electrode and includes an opening;
   a second electrode formed above the compound semiconductor layer; and
   a gate electrode embedded in the opening lined with an insulating film;
   wherein the compound semiconductor layer comprises:
   a first compound semiconductor;
   a second compound semiconductor formed on the first compound semiconductor;
   a third compound semiconductor formed on the second compound semiconductor; and
   a fourth compound semiconductor in contact with a side surface of the insulating film, a side surface of the first compound semiconductor, a side surface of the second compound semiconductor, and a side surface of the third compound semiconductor, wherein
   a region where the fourth compound semiconductor does not exist is formed directly below the gate electrode, and
   a two-dimensional electron gas is produced at an interface of the first compound semiconductor with the fourth compound semiconductor and at an interface of the third compound semiconductor with the fourth compound semiconductor.

2. The compound semiconductor device according to claim 1, wherein the interface of the second compound semiconductor with the fourth compound semiconductor is a region where no two-dimensional electron gas is produced.

3. The compound semiconductor device according to claim 1, wherein the insulating film is thicker in a portion in contact with a lower surface of the gate electrode than a portion in contact with a side surface of the gate electrode.

4. The compound semiconductor device according to claim 1, wherein:
   the compound semiconductor layer further comprises a fifth compound semiconductor formed above the third compound semiconductor, the fifth compound semiconductor being formed under the second electrode; and
   the fifth compound semiconductor contains a conductive impurity in a concentration higher than that of the third compound semiconductor.

5. The compound semiconductor device according to claim 1, wherein the insulating film contains one or a plurality of materials selected from the group consisting of SiN, HfO, TaO and AlO.

6. A compound semiconductor device comprising:
   a first electrode;
   a compound semiconductor layer which is formed above the first electrode and includes an opening;
   a second electrode formed above the compound semiconductor layer; and
   a gate electrode embedded in the opening lined with an insulating film;
   wherein the compound semiconductor layer comprises:
   a first compound semiconductor;
   a second compound semiconductor formed on the first compound semiconductor;
   a third compound semiconductor formed on the second compound semiconductor; and
   a fourth compound semiconductor in contact with a side surface of the insulating film, a side surface of the first compound semiconductor, a side surface of the second compound semiconductor, and a side surface of the third compound semiconductor, wherein
   the lattice constant of the second compound semiconductor is smaller than the lattice constants of the first compound semiconductor and the third compound semiconductor;
   the lattice constant of the fourth compound semiconductor is smaller than the lattice constants of the first compound semiconductor and the third compound semiconductor; and
   a region where the fourth compound semiconductor does not exist is formed directly below the gate electrode.

7. The compound semiconductor device according to claim 6, wherein the lattice constant of the second compound semiconductor is smaller than or equal to the lattice constant of the fourth compound semiconductor.

8. The compound semiconductor device according to claim 6, wherein the insulating film is thicker in a portion in contact with a lower surface of the gate electrode than a portion in contact with a side surface of the gate electrode.

9. The compound semiconductor device according to claim 6, wherein:
   the compound semiconductor layer further comprises a fifth compound semiconductor formed above the third compound semiconductor, the fifth compound semiconductor being formed under the second electrode; and
   the fifth compound semiconductor contains a conductive impurity in a concentration higher than that of the third compound semiconductor.

10. The compound semiconductor device according to claim 6, wherein the insulating film contains one or a plurality of materials selected from the group consisting of SiN, HfO, TaO and AlO.

* * * * *